(12) United States Patent
Hietala et al.

(10) Patent No.: US 6,816,101 B2
(45) Date of Patent: Nov. 9, 2004

(54) HIGH-SPEED ANALOG-TO-DIGITAL CONVERTER USING A UNIQUE GRAY CODE

(75) Inventors: Vincent Mark Hietala, Albuquerque, NM (US); Andrew Joo Kim, Atlanta, GA (US)

(73) Assignee: Quelian, Inc., Atlanta, GA (US)

( * ) Notice: Subject to any disclaimer, the term of this patent is extended or adjusted under 35 U.S.C. 154(b) by 0 days.

(21) Appl. No.: 10/383,703

(22) Filed: Mar. 7, 2003

(65) Prior Publication Data

US 2003/0169195 A1 Sep. 11, 2003

Related U.S. Application Data

(60) Provisional application No. 60/362,721, filed on Mar. 8, 2002.

(51) Int. Cl.[7] ................................................. H03M 1/12
(52) U.S. Cl. ....................................... 341/155; 341/126
(58) Field of Search ............................ 341/155, 126, 341/97, 92, 110

(56) References Cited

U.S. PATENT DOCUMENTS

| | | | |
|---|---|---|---|
| 2,632,058 A | 3/1953 | Gray | .......................... 375/242 |
| 3,445,771 A | 5/1969 | Clapham et al. | |
| 3,571,725 A | 3/1971 | Kaneko et al. | |

(List continued on next page.)

FOREIGN PATENT DOCUMENTS

| | | | |
|---|---|---|---|
| EP | 0 527 966 B1 | 9/1994 | |
| EP | 0 584 865 B1 | 3/2000 | |
| GB | 2 223 369 A | * | 4/1990 |

(List continued on next page.)

OTHER PUBLICATIONS

André; InP DHBT Technology and Design Methodology for High–Bit–Rate Optical Communications Circuits; IEEE Journal of Solid–State Circuits; vol. 33, No. 9, Sep. 1998; pp. 1328–1335.

Borjak et al.; High–Speed Generalized Distributed–Amplifier–Based Transversal–Filter Topology for Optical Communication Systems; IEEE Transactions on Microwave Theory and Techniques; vol. 45, No. 8, Aug. 1997; pp. 1453–1457.

(List continued on next page.)

Primary Examiner—Jean Bruner Jeanglaude
(74) Attorney, Agent, or Firm—King & Spalding, LLP

(57) ABSTRACT

A method for high speed communications uses an inventive Q-Gray code. The Q-Gray code simplifies the hardware needed to convert analog Q-Gray code signals to digital signals. An analog-to-digital converter can use a plurality of comparators for receiving the multilevel signal and a plurality of decoder blocks coupled to comparators for decoding the multilevel signal. Each decoder block can include an equal number of inputs. Specifically, each decoder block can also include a parity detector with an equal number of inputs. Each decoder block can also employ a bank of identical parity detectors relative to another decoder block. Each comparator of the analog to digital converter can have an individually or externally adjustable (or both) threshold level.

47 Claims, 11 Drawing Sheets

U.S. PATENT DOCUMENTS

| | | | |
|---|---|---|---|
| 3,714,437 A | 1/1973 | Kinsel | |
| 3,806,915 A | 4/1974 | Higgins et al. | |
| 3,977,795 A | 8/1976 | Buschmann | |
| 4,287,756 A | 9/1981 | Gallagher | |
| 4,349,914 A | 9/1982 | Evans | |
| 4,363,127 A | 12/1982 | Evans et al. | |
| 4,386,339 A | 5/1983 | Henry et al. | |
| 4,387,461 A | 6/1983 | Evans | |
| 4,393,499 A | 7/1983 | Evans | |
| 4,464,771 A | 8/1984 | Sorensen | 375/374 |
| 4,470,126 A | 9/1984 | Haque | |
| 4,479,266 A | 10/1984 | Eumurian et al. | |
| 4,521,883 A | 6/1985 | Roche | |
| 4,584,720 A | 4/1986 | Garrett | |
| 4,618,941 A | 10/1986 | Linder et al. | 708/319 |
| 4,651,026 A | 3/1987 | Serfaty et al. | 327/98 |
| 4,751,497 A | 6/1988 | Torii | |
| 4,830,493 A | 5/1989 | Giebeler | |
| 4,847,521 A | 7/1989 | Huignard et al. | |
| 4,864,590 A | 9/1989 | Arnon et al. | |
| 4,912,726 A | 3/1990 | Iwamatsu et al. | 375/294 |
| 4,942,593 A | 7/1990 | Whiteside et al. | |
| 4,959,535 A | 9/1990 | Garrett | |
| 4,978,957 A | 12/1990 | Hotta et al. | |
| 5,007,106 A | 4/1991 | Kahn et al. | |
| 5,008,957 A | 4/1991 | Kiyono | |
| 5,012,475 A | 4/1991 | Campbell | |
| 5,067,126 A | 11/1991 | Moore | |
| 5,072,221 A * | 12/1991 | Schmidt | 341/159 |
| 5,111,065 A | 5/1992 | Roberge | |
| 5,113,278 A | 5/1992 | Degura et al. | |
| 5,115,450 A | 5/1992 | Arcuri | 375/219 |
| 5,121,411 A | 6/1992 | Fluharty | 375/293 |
| 5,128,790 A | 7/1992 | Heidemann et al. | |
| 5,132,639 A | 7/1992 | Blauvelt et al. | |
| 5,151,698 A | 9/1992 | Pophillat | |
| 5,181,034 A | 1/1993 | Takakura et al. | |
| 5,184,131 A * | 2/1993 | Ikeda | 341/165 |
| 5,208,833 A | 5/1993 | Erhart et al. | 375/294 |
| 5,222,103 A | 6/1993 | Gross | |
| 5,223,834 A * | 6/1993 | Wang et al. | 341/136 |
| 5,225,798 A | 7/1993 | Hunsinger et al. | |
| 5,237,590 A | 8/1993 | Kazawa et al. | 375/293 |
| 5,243,613 A | 9/1993 | Gysel et al. | |
| 5,252,930 A | 10/1993 | Blauvelt | |
| 5,282,072 A | 1/1994 | Nazarathy et al. | |
| 5,283,679 A | 2/1994 | Wedding | |
| 5,291,031 A | 3/1994 | MacDonald et al. | |
| 5,293,406 A | 3/1994 | Suzuki | |
| 5,300,930 A | 4/1994 | Burger et al. | |
| 5,321,543 A | 6/1994 | Huber | |
| 5,321,710 A | 6/1994 | Cornish et al. | |
| 5,327,279 A | 7/1994 | Farina et al. | |
| 5,343,322 A | 8/1994 | Pirio et al. | |
| 5,351,148 A | 9/1994 | Maeda et al. | |
| 5,355,240 A | 10/1994 | Prigent et al. | |
| 5,361,156 A | 11/1994 | Pidgeon | |
| 5,371,625 A | 12/1994 | Wedding et al. | |
| 5,373,384 A | 12/1994 | Hebert | |
| 5,376,786 A | 12/1994 | MacDonald | |
| 5,382,955 A | 1/1995 | Knierim | |
| 5,387,887 A | 2/1995 | Zimmerman et al. | |
| 5,408,485 A | 4/1995 | Ries | |
| 5,413,047 A | 5/1995 | Evans et al. | |
| 5,416,628 A | 5/1995 | Betti et al. | |
| 5,418,637 A | 5/1995 | Kuo | |
| 5,424,680 A | 6/1995 | Nazarathy et al. | |
| 5,428,643 A | 6/1995 | Razzell | |
| 5,436,752 A | 7/1995 | Wedding | |
| 5,436,756 A | 7/1995 | Knox et al. | |
| 5,450,044 A | 9/1995 | Hulick | |
| 5,481,389 A | 1/1996 | Pidgeon et al. | |
| 5,481,568 A | 1/1996 | Yada | |
| 5,504,633 A | 4/1996 | Van Den Enden | |
| 5,510,919 A | 4/1996 | Wedding | |
| 5,528,710 A | 6/1996 | Burton et al. | |
| 5,548,253 A | 8/1996 | Durrant | |
| 5,574,743 A | 11/1996 | van der Poel et al. | |
| 5,589,786 A | 12/1996 | Bella et al. | |
| 5,612,653 A | 3/1997 | Dodds et al. | |
| 5,625,360 A | 4/1997 | Garrity et al. | |
| 5,644,325 A | 7/1997 | King et al. | |
| 5,670,871 A | 9/1997 | Man et al. | |
| 5,675,600 A | 10/1997 | Yamamoto | |
| 5,678,198 A | 10/1997 | Lemson | |
| 5,689,356 A | 11/1997 | Rainal | |
| 5,706,008 A | 1/1998 | Huntley, Jr. et al. | |
| 5,721,315 A | 2/1998 | Evans et al. | |
| 5,723,176 A | 3/1998 | Keyworth et al. | |
| 5,754,681 A | 5/1998 | Watanabe et al. | |
| 5,757,763 A | 5/1998 | Green et al. | |
| 5,761,243 A | 6/1998 | Russell et al. | |
| 5,764,542 A | 6/1998 | Gaudette et al. | |
| 5,783,630 A | 7/1998 | Evans et al. | |
| 5,784,032 A | 7/1998 | Johnston et al. | |
| 5,798,854 A | 8/1998 | Blauvelt et al. | |
| 5,801,657 A * | 9/1998 | Fowler et al. | 341/155 |
| 5,802,089 A | 9/1998 | Link | |
| 5,812,578 A | 9/1998 | Schemmann et al. | |
| 5,825,211 A | 10/1998 | Smith et al. | |
| 5,825,257 A | 10/1998 | Klymyshyn et al. | |
| 5,825,825 A | 10/1998 | Altmann et al. | |
| 5,828,329 A | 10/1998 | Burns | |
| 5,839,105 A | 11/1998 | Ostendorf et al. | |
| 5,841,841 A | 11/1998 | Dodds et al. | |
| 5,844,436 A | 12/1998 | Altmann | |
| 5,848,139 A | 12/1998 | Grover | |
| 5,850,409 A | 12/1998 | Link | |
| 5,850,505 A | 12/1998 | Grover et al. | |
| 5,852,389 A | 12/1998 | Kumar et al. | |
| 5,859,862 A | 1/1999 | Hikasa et al. | |
| 5,861,966 A | 1/1999 | Ortel | |
| 5,872,468 A | 2/1999 | Dyke | 327/72 |
| 5,878,390 A | 3/1999 | Kawai et al. | |
| 5,880,870 A | 3/1999 | Sieben et al. | |
| 5,883,910 A | 3/1999 | Link | |
| 5,887,022 A | 3/1999 | Lee et al. | |
| 5,889,759 A | 3/1999 | McGibney | |
| 5,896,392 A | 4/1999 | Ono et al. | |
| 5,912,749 A | 6/1999 | Harstead et al. | |
| 5,920,600 A | 7/1999 | Yamaoka et al. | |
| 5,923,226 A | 7/1999 | Kakura et al. | |
| 5,942,576 A | 8/1999 | Evans et al. | |
| 5,943,380 A | 8/1999 | Marchesani et al. | |
| 5,943,457 A | 8/1999 | Hayward et al. | |
| 5,949,926 A | 9/1999 | Davies | |
| 5,959,032 A | 9/1999 | Evans et al. | |
| 5,959,750 A | 9/1999 | Eskildsen et al. | |
| 5,965,667 A | 10/1999 | Evans et al. | |
| 5,983,178 A | 11/1999 | Naito et al. | |
| 5,985,999 A | 11/1999 | Dominguez et al. | |
| 5,999,300 A | 12/1999 | Davies et al. | |
| 6,002,274 A | 12/1999 | Smith et al. | |
| 6,009,424 A | 12/1999 | Lepage et al. | |
| 6,021,110 A | 2/2000 | McGibney | |
| 6,028,658 A | 2/2000 | Hamada et al. | |
| 6,031,048 A | 2/2000 | Evans et al. | |
| 6,031,866 A | 2/2000 | Oler et al. | |
| 6,031,874 A | 2/2000 | Chennakeshu et al. | |
| 6,034,996 A | 3/2000 | Herzberg | |
| 6,035,080 A | 3/2000 | Henry et al. | |

| | | | |
|---|---|---|---|
| 6,041,299 A | 3/2000 | Schuster et al. | |
| 6,072,364 A | 6/2000 | Jeckeln et al. | |
| 6,072,615 A | 6/2000 | Mamyshev | |
| 6,078,627 A | 6/2000 | Crayford | |
| 6,084,931 A | 7/2000 | Powell, II et al. | |
| 6,091,782 A | 7/2000 | Harano | |
| 6,093,496 A | 7/2000 | Dominguez et al. | |
| 6,093,773 A | 7/2000 | Evans et al. | |
| 6,108,474 A | 8/2000 | Eggleton et al. | |
| 6,111,477 A | 8/2000 | Klymyshyn et al. | |
| 6,118,563 A | 9/2000 | Boskovic et al. | |
| 6,118,567 A | 9/2000 | Alameh et al. | |
| 6,127,480 A | 10/2000 | Dominguez et al. | |
| 6,140,416 A | 10/2000 | Evans et al. | |
| 6,140,858 A | 10/2000 | Dumont | |
| 6,140,972 A | 10/2000 | Johnston et al. | |
| 6,141,127 A | 10/2000 | Boivin et al. | |
| 6,141,387 A | 10/2000 | Zhang | |
| 6,148,428 A | 11/2000 | Welch et al. | |
| 6,151,150 A | 11/2000 | Kikuchi | |
| 6,154,301 A | 11/2000 | Harvey | |
| 6,163,638 A | 12/2000 | Eggleton et al. | |
| 6,181,454 B1 | 1/2001 | Nagahori et al. | |
| 6,191,719 B1 | 2/2001 | Bult et al. | |
| 6,201,916 B1 | 3/2001 | Eggleton et al. | |
| 6,208,792 B1 | 3/2001 | Hwang et al. | |
| 6,212,654 B1 | 4/2001 | Lou et al. | |
| 6,214,914 B1 | 4/2001 | Evans et al. | |
| 6,219,633 B1 | 4/2001 | Lepage | |
| 6,226,112 B1 | 5/2001 | Denk et al. | |
| 6,236,963 B1 | 5/2001 | Naito et al. | |
| 6,259,836 B1 | 7/2001 | Dodds | |
| 6,259,847 B1 | 7/2001 | Lenz et al. | |
| 6,268,816 B1 | 7/2001 | Bult et al. | |
| 6,271,944 B1 | 8/2001 | Schemmann et al. | |
| 6,281,824 B1 | 8/2001 | Masuda | |
| 6,288,668 B1 * | 9/2001 | Tsukamoto et al. | 341/172 |
| 6,289,055 B1 | 9/2001 | Knotz | |
| 6,289,151 B1 | 9/2001 | Kazarinov et al. | |
| 6,298,459 B1 | 10/2001 | Tsukamoto | |
| 6,304,199 B1 | 10/2001 | Fang et al. | |
| 6,317,469 B1 | 11/2001 | Herbert | 375/293 |
| 6,341,023 B1 | 1/2002 | Puc | |
| 6,473,131 B1 | 10/2002 | Neugebauer et al. | |

FOREIGN PATENT DOCUMENTS

| | | |
|---|---|---|
| GB | 2 306 066 A | 4/1997 |
| JP | 62082659 | 10/1988 |
| JP | 1990000063162 | 11/1991 |
| JP | 04187738 | 7/1992 |
| JP | 08079186 A | 3/1996 |
| WO | WO 99/45683 | 9/1999 |
| WO | WO 01/41346 A2 | 6/2001 |

OTHER PUBLICATIONS

Buchali et al.; Fast Eye Monitor for 10 Gbit/s and its Application for Optical PMD Compensation; Optical Society of America; (2000); pp. TuP5–1–TuP1–3.

Cartledge et al.; Performance of Smart Lightwave Receivers With Linear Equalization; Journal of Lightwave Technology; vol. 10, No. 8; Aug. 1992; pp. 1105–1109.

Cimini et al., Can Multilevel Signaling Improve the Spectral Efficiency of ASK Optical FDM Systems?; IEEE Transactions on Communications; vol. 41, No. 7; Jul. 1993; pp. 1084–1090.

Downie et al.; Performance Monitoring of Optical Networks with Synchronous and Asynchronous Sampling; p. WDD50–1 no date.

Enning et al.; Design and Test of Novel Integrate and Dump Filter (I&D) for Optical Gbit/s System Applications; Electronics Letters; (Nov. 21, 1991); vol. 27, No. 24; pp. 2286–2288.

Godin et al.; A InP DHBT Technology for High Bit–rate Optical Communications Circuits; IEEE; (1997); pp. 219–222.

Haskins et al.; FET Diode Linearizer Optimization for Amplifier Predistortion in Digital Radios; IEEE Microwave and Guided Wave Letters; vol. 10, No. 1; Jan. 2000; pp. 21–23.

Hranilovic et al.; A Multilevel Modulation Scheme for High–Speed Wireless Infrared Communications; IEEE; (1999); pp. VI–338–VI–341.

Jutzi, Wilhelm; Microwave Bandwidth Active Transversal Filter Concept with MESFETs; IEEE Transactions on Microwave Theory and Technique, vol. MTT–19, No. 9; Sep. 1971; pp. 760–767.

Lee et al.; Effects of Decision Ambiguity Level on Optical Receiver Sensitivity; IEEE Photonics Technology Letters; vol. 7, No. 19; Oct. 1995; pp. 1204–1206.

D. Marcuse; Calculation of Bit–Error Probability for a Lightwave System with Optical Amplifiers and Post–Detection Gaussian Noise; Journal of Lightwave Technology; vol. 9, No. 4; Apr. 1999; pp. 505–513.

Megherbi et al.; A GaAs–HBT A/D Gray–code converter; IEEE; (1997); pp. 209–212.

Nazarathy et al.; Progress in Externally Modulated AM CATV Transmission Systems; Journal of Lightwave Technology; vol. 11, No. 1; Jan. 1993; pp. 82–105.

Oehler et al.; A 3.6 Gigasample/s 5 bit Analog to Digital Converter Using 0.3 $\mu$m AlGaAS–HEMT Technology; IEEE; (1993); pp. 163–164.

Ota et al.; High–Speed, Burst–Mode, Packet–Capable Optical Receiver and Instantaneous Clock Recovery for Optical Bus Operation; Journal of Lightwave Technology; vol. 12; Feb. 1994; pp. 325–331.

Poulton et al.; An 8–Gsa/s 8–bit ADC Systems; Symposium on VLSI Circuits Digest of Technical Papers; (1997); pp. 23–24.

Poulton et al.; A 6–b, 4 Gsa/s GaAs HBT ADC; IEEE Journal of Solid–State Circuits; vol. 30, No. 10.; Oct. 1995; pp. 1109–1118.

Poulton et al.; A 6–bit, 4 Gsa/s ADC Fabricated in a GaAs HBT Process; IEEE; (1994); pp. 240–243.

Prasetyo et al.; Application for Amplitude Gain Estimation Techniques for Multilevel Modulation in OFDM Systems; IEEE; (1998); pp. 821–824.

Shtaif et al.; Limits on the Spectral Efficiency of Intensity Modulated Direct Detection Systems with Optical Amplifiers; AT&T Labs Research; pp. MM1–1–MM1–3, no date.

Su et al.; Inherent Transmission Capacity Penalty of Burst–Mode Receiver for Optical Multiaccess Networks; IEEE Photonics Technology Letters; vol. 6, No. 5; May 1994; pp. 664–667.

Wang et al.; Multi–Gb/s Silicon Bipolar Clock Recovery IC; IEEE Journal on Selected Areas in Communications; vol. 9, No. 5; Jun. 1991; pp. 656–663.

Webb, William T.; Spectrum Efficiency of Multilevel Modulation Schemes in Mobile Radio Communications; IEEE Transactions on Communications; vol. 43, No. 8; Aug. 1995; pp. 2344–2349.

Wedding et al.; Fast Adaptive Control for Electronic Equalization of PMD; Optical Society of America; (2000); pp. TuP4–1–TuP–3.

Wilson et al.; Predistortion of Electroabsorption Modulators for Analog CATV Systems at 1.55 μm; Journal of Lightwave Technology; vol. 15, No. 9; Sep. 1997; pp. 1654–1662.

Author: Unknown; Digital Carrier Modulation Schemes; Title: Unknown; Date: Unknown; pp. 380–442, no date.

Fürst et al.; *Performance Limits of Nonlinear RZ and NRZ Coded Transmission at 10 and 40 Gb/s on Different Fibers*; pp. 302–304, no date.

Garrett, Ian; *Pulse–Position Modulation for Transmission Over Optical Fibers with Direct or Heterodyne Detection*; IEEE Transactions on Communications; vol. COM–31; No. 4; Apr. 1983; pp. 518–527.

Idler et al; *40 Gbit/s Quaternary Dispersion Supported Transmission Field Trial Over 86 km Standard Singlemode Fibre*; 24th European Conference on Optical Communication; Sep., 1998; pp. 145–147.

Ohtsuki et al.; *BER Performance of Turbo–Coded PPM CDMA Systems on Optical Fiber*; Journal of Lightwave Technology; vol. 18; No. 12; Dec., 2000; pp. 1776–1784.

Vorenkamp et al.; *A 1Gs/s, 10b Digital–to–Analog Converter*, ISSCC94/Session 3/Analog Techniquest/Paper WP 3.3; pp. 52–53, no date.

Walkin et al.; *A 10 Gb/s 4–ary ASK Lightwave System*; ECOC; 1997; pp. 255–258.

Walklin et al.; *Multilevel Signaling for Extending the Dispersion–Limited Transmission in High–Speed, Fiber Optic Communication Systems*; IEEE; 1996; pp. 233–236.

Walklin et al.; *Multilevel Signaling for Increasing the Reach of 10 Gb/s Lightwave Systems*; IEEE Journal of Lightwave Technology; vol. 17; No. 11; Nov., 1999; pp. 2235–2248.

Wedding et al.; *Multi–level Dispersion Supported Transmission at 20 Gbit/s Over 46 km Installed Standard Singlemode Fibre*; 22nd European Conference on Optical Communications; 1996; pp. 91–94.

International Search Report dated May 29, 2003 for International Application No. PCT/US03/04626.

Wang, Z. et al., "Multi–Gb/s Silicon Bipolar Clock Recovery IC", IEEE Journal on Selected Areas in Communications, vol. 9., No. 5, Jun. 1991, pp. 656–663.

Vodhanel, R. et al. "Performance of directly modulated DFB lasers in 10–Gb/s ASK, FAK, and DPSK lightwave system" Journal of Lightwave Technology, Sep. 1990. vol. 8, No. 9: 1379–1386.

Chiang et al. "Implementation of STARNET: a WDM computer communications network." IEEE Journal on Selected Areas in Communications. Jun. 1996. vol. 14, No. 5:824–839.

Kaiser et al. "Reduced complexity optical duobinary 10–Gb/s transmitter setup resulting in an increased transmission distance." IEEE Photonics Technology Letters. Aug. 2001. vol. 13, No. 8: 1041–1135.

Ohm, M. and J. Speidel. "Quaternary optical ASK–DPSK and receivers with direct detection." IEEE Photonics Technology Letters. Jan. 2003. vol. 15, No. 1: 159–161.

Search Report for PCT/US03/12422 dated Aug. 11, 2003.

Kaess, F. et al., "New Encoding Scheme for High–Speed Flash ADC's" 1977 IEEE International Symposium on Circuits and Systems, Jun. 9–12, 1997, Hong Kong, pp. 5–8.

Wakimoto, Tsutomu et al., Si Bipolar 2–GHz 6–bit Flash A/D Conversion LSI, IEEE Journal of Solid–State Circuits, vol. 23, No. 6, Dec. 1988, pp. 1345–1350.

International Search Report dated Sep. 24, 2003 for International Application No. PCT/US03/06774.

Chi, N. et al., "Transmission performance of all–optically labeled packets using ASK/DPSK orthogonal modulation." The 15th Annual Meeting of the IEEE Lasers and Electro–Optics Society, 2002. LEOS 2002. Nov. 10–14, 2002. vol. 1:51–52. the whole document.

Runge et al.; *High–Speed Circuits for Lightwave Communications*; 1999; World Scientific, pp. 181–184.

Westphal et al.; *Lightwave Communications*; 1994; Thursday Afternoon/CLEO '94; pp. 337–338.

* cited by examiner

HIGH-SPEED ANALOG-TO-DIGITAL CONVERTER USING A UNIQUE GRAY CODE

STATEMENT REGARDING RELATED APPLICATIONS

The present application claims priority under 35 U.S.C. § 119(e) to provisional patent application entitled, "HIGH-SPEED ANALOG-TO-DIGITAL CONVERTER USING A UNIQUE GRAY CODE," filed on Mar. 8, 2002 and assigned U.S. application Ser. No. 60/362,721, the entire contents of which are hereby incorporated by reference.

FIELD OF THE INVENTION

The present invention is directed to analog-to-digital (ADC) converters and, more particularly, a very high-speed ADC is described for the level detection of, or equivalently, the data extraction from high-speed multilevel (ML) waveforms.

BACKGROUND OF THE INVENTION

Complex modulation schemes are desirable to obtain increased spectral efficiency and, therefore, increased data throughput for high-speed communications systems. The extraction of data from the multi-Giga symbol per second (Gsym/s) ML waveforms can be difficult, but is critical for effective implementation of a high-speed communications system.

Conventional flash ADC's are common in high-speed systems; however, these ADC's suffer three shortcomings. First, they are based on conventional Gray codes that result in asymmetric decoder circuitry in the sense that the circuitry for decoding the simplest bit channel can be significantly more complex than the circuitry for the most complex bit channel.

Conventional Gray codes are described in U.S. Pat. No. 2,632,058, entitled "Pulse Code Communication", which issued to Gray on Mar. 17, 1953. This reflected-binary code (now generally called a Gray code) described in the '058 patent provides for improved performance of pulse coded communications based on encoding data in time vs. voltage.

With conventional Gray code analog to digital decoders, buffers are usually used to delay the result from the simplest bit channel to match the output delay of the most complex channel. The overall result is an ADC that has high complexity which translates into high power consumption and lower achievable speed.

The second shortcoming of flash ADC's based on conventional Gray codes is that the error rate on each of the bit channels is skewed. This skew can reduce the performance of error correction mechanisms where it is assumed each bit channel has the same error probability.

The third shortcoming of conventional flash ADC's is that they have uniformly spaced decoding thresholds. In many communication contexts, the received signal is distorted by signal dependent noise and the use of uniformly spaced thresholds is suboptimal.

In view of the foregoing, there is a need in the art for an ADC where the thresholds are independently and externally adjustable to provide a means for maintaining optimal decoding in the presence of (possibly time-varying) signal dependent distortions. There is a further need in the art for an ADC that can support the adjustable quantization of ML signals within the receiver of a high-speed telecommunication system. Another need exists in the art for an evenly distributed bit error rate across each of the bit channels in a multilevel signal. And further, a need exists in the art for a simpler ADC design for high speed communications.

SUMMARY OF THE INVENTION

A design for an analog-to-digital converter that can decode a unique multilevel Gray code can be made more simple than conventional analog to digital converters. More specifically, because of certain properties of the inventive and exemplary Q-Gray codes of the present invention, the analog-to-digital converter can comprise a plurality of comparators for receiving the multilevel signal and a plurality of decoder blocks coupled to comparators for decoding the multilevel signal. Each decoder block can comprise an equal number of inputs. Specifically, each decoder block can also comprise a parity detector with an equal number of inputs. Each decoder block can also comprise a bank of identical parity detectors relative to another decoder block.

According to another exemplary aspect of the present invention, in one exemplary embodiment, each comparator of the analog to digital converter can have an individually adjustable threshold level. Further, each comparator can also have an externally controllable threshold level. With such individually adjustable thresholds, the comparators can process a multilevel signal comprising non-uniformly spaced decoding thresholds.

With this simple design, the analog to digital converter can reduce dissipated power and can increase achievable operational speeds for communications. Some unique properties of the Q-Gray coded multilevel signal that dictate the design of the aforementioned analog to digital converter are the following: The maximum number of bit-toggles incurred in a bit channel while sequentially traversing the code is minimized. An example of a situation in which the above minimum-maximum criterion is satisfied is when the Q-Gray code has a transition density that is maximally evenly distributed among bits in the binary representation of the multilevel signal. This maximally even transition distribution results in the property that the bit error rate is substantially evenly distributed across each bit channel.

The present invention provides for a method of high speed communications using an inventive Q-Gray code. In turn, the Q-Gray code simplifies the hardware needed to convert multilevel Q-Gray coded signals to binary signals.

DETAILED DESCRIPTION OF EXEMPLARY EMBODIMENTS

Figure 1A:
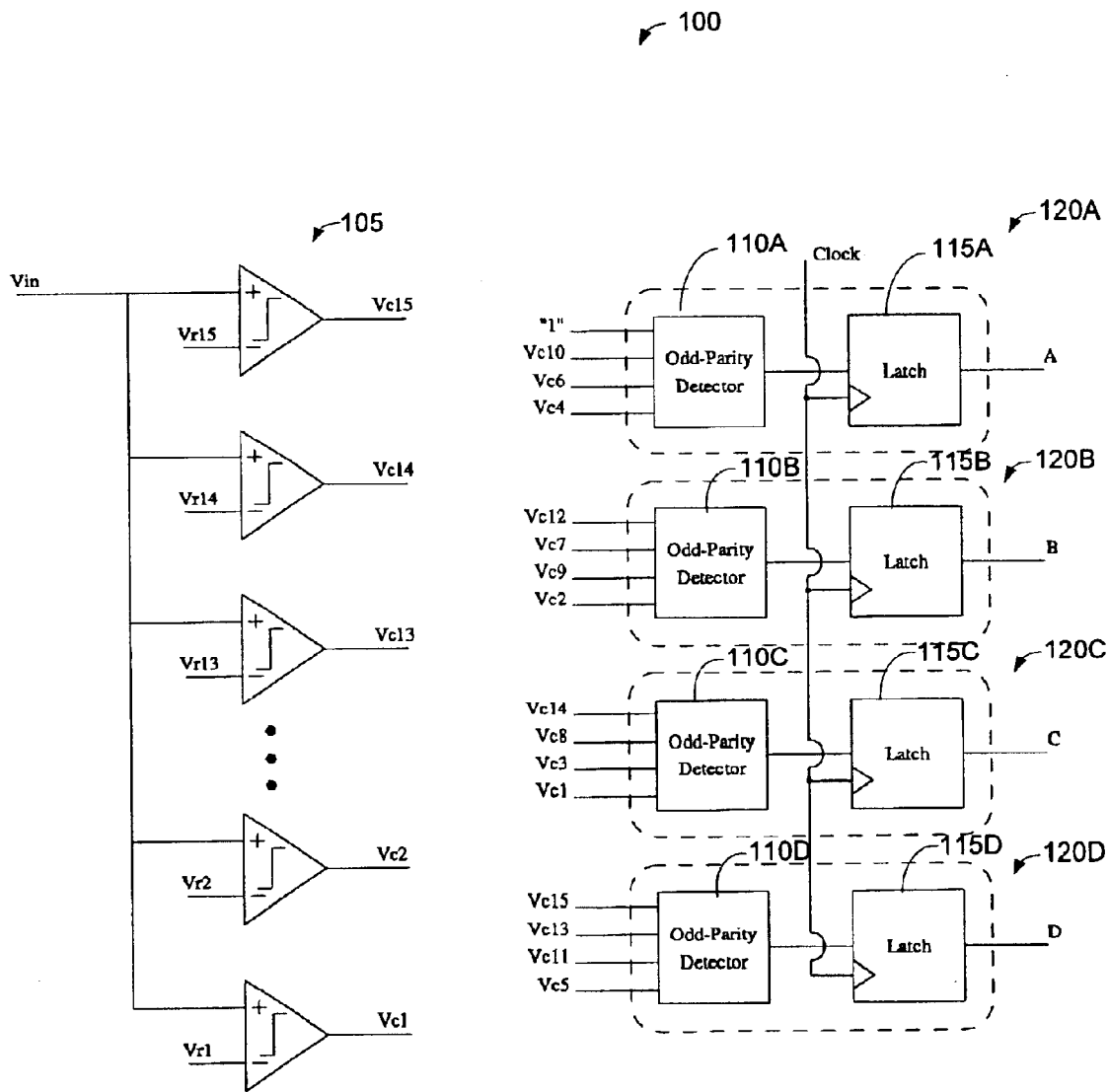
FIG. 1A is a block diagram of an exemplary 4-bit analog-to-digital converter (ADC) according to one exemplary embodiment of the present invention.

The use of an innovative "Q-Gray code" described herein allows for simplification of the decoder of flash-based ADC's and in a faster ADC design. As an additional benefit, the Q-Gray code is also an optimal code for ML communication systems. The general class of Q-Gray codes has the unique property of allowing for a corresponding flash ADC to have minimal decoder complexity and therefore maximum conversion speed with minimal power consumption.

The Q-Gray codes of the present invention are a subset of the large class of Gray codes. Specifically, the Q-Gray codes of the present invention are Gray codes with the following property: letting $M_b$ denotes the maximum number of bit toggles incurred in bit position b as the code is incremented from 0 to $2^N-1$ and followed by 0 (where N is the number of bits comprising the code), a Q-Gray code achieves the minimum possible value of $\max_b\{M_b\}$, (i.e. the largest number of toggles incurred over any bit position is minimized). Thus, a Q-Gray code distributes the number bit toggles (from adjacent level transitions) as evenly as possible over all the bit positions.

This defining property of Q-Gray codes minimizes the maximum number of aggregate number of bit toggles (on adjacent level transitions) on any bit position. In other words, for the inventive Q-Gray codes, the maximum number of bit-toggles incurred in a bit channel while sequentially traversing the code is minimized. This not only allows for simple bit decoders within the ADC, but also offers the total bit error rate to be approximately $1/\log_2 N$ of the symbol error rate (as with any Gray code) and an approximately equal error rate for each bit of the code words (which does not hold for most Gray codes).

In order to understand the impact of coding upon an ADC design, Table 1 lists several possible coding candidates, one of which is according to an exemplary embodiment of the present invention. As in Table 1, much of this document will use N=4-bit coding (i.e. 16-level modulation) as an example; however, the extension to other numbers of bits will be clear to those skilled in the art and are included as part of the present invention. Table 1 presents a conventional binary code, a conventional Gray code, and one exemplary Gray code of the present invention that has been labeled as a "Q-Gray" code.

TABLE 1

Comparison of several possible 4-bit ML codes.

| Level | Binary | Gray Code | Q-Gray Code |
|---|---|---|---|
| 15 | 1111 | 1000 | 0000 |
| 14 | 1110 | 1001 | 0001 |
| 13 | 1101 | 1011 | 0011 |
| 12 | 1100 | 1010 | 0010 |
| 11 | 1011 | 1110 | 0110 |
| 10 | 1010 | 1111 | 0111 |
| 9 | 1001 | 1101 | 1111 |
| 8 | 1000 | 1100 | 1011 |
| 7 | 0111 | 0100 | 1001 |
| 6 | 0110 | 0101 | 1101 |
| 5 | 0101 | 0111 | 0101 |
| 4 | 0100 | 0110 | 0100 |
| 3 | 0011 | 0010 | 1100 |
| 2 | 0010 | 0011 | 1110 |
| 1 | 0001 | 0001 | 1010 |
| 0 | 0000 | 0000 | 1000 |

In order to appreciate the features of the Q-Gray code, it will be useful to first review some background material. First, a symbol for a simple ML communication system is simply an amplitude level. A symbol error occurs when a received symbol is different than the symbol that was transmitted. A bit error occurs when a received data bit is different than the transmitted data bit. Note that in general, a data error(s) will occur when a symbol error occurs, but the number of data errors which occur depends on the nature of the error as well as the way that the data bits represent the symbol (i.e. the coding used).

For a ML system, almost all errors result from the case where a received symbol is wrongly detected as an adjacent symbol level. Therefore, the coding used should minimize the number of bits that will be in error if a symbol is in error by one level. The traditional Gray-code does exactly this, by having the code words for any pair of adjacent levels differ in only one bit position.

In order to further explain this, define the following:

$P(err_s)$ is the symbol error probability (or rate), $P(err_b)$ is the total bit error probability (or rate), and $P(err_{b=A})$, $P(err_{b=B})$, $P(err_{b=C})$, and $P(err_{b=D})$ are the bit error probabilities (or rates) of bit A, B, C, and D, respectively.

The following discussion will also use the standard notation for conditional probabilities where $P(X\backslash Y)$ means "the probability of" X "given" Y. Multiple conditions will be separated by ","'s as in $P(X\backslash Y,Z)$ means the probability of X given Y and Z.

For the following discussions, in regard to any given code, the bits will be termed A, B, C, and D, in sequence from left to right with A being the left-most bit and D being the right-most bit. The transmitted level will be referred to as L and the received level as $\hat{L}$. We will assume that each symbol is equally likely to be transmitted, i.e., $P(L)=\frac{1}{16}$ where L=0, . . . ,15 is the symbol transmitted. The vast majority of communications channels have noise characteristics in which smaller noise perturbations are more likely than larger perturbations, e.g., Gaussian noise. In such situations, errors in detecting the symbol are almost always due to declaring a level adjacent to the one transmitted, i.e. declaring $\hat{L}=L-1$ or $\hat{L}=L+1$. If optimal detection is used, then the probability of these two types of errors is the same, i.e., $P(\hat{L}=L-1\backslash L)=P(\hat{L}=L+1\backslash L)$.

If we additionally assume that optimal transmit level spacing is used, then the above error probabilities are independent of the transmit level, as shown in Equation (1):

$$\frac{1}{2}P(err_s) = P(\hat{L} = L - 1 | L) = P(\hat{L} = L + 1 | L) \quad (1)$$

for all L except in the degenerate case where $\hat{L}=-1$ and $\hat{L}=16$ for which the probability of these types of errors is zero since the receiver only makes detections corresponding to valid symbols.

The bit error probability can now be shown to approximately be the symbol error probability multiplied by a scalar that is a characteristic of the particular binary code used to represent the symbols. This scalar multiplier corresponds to the average number of bit toggles incurred as the binary representation is sequentially traversed. To be more specific, define the bit toggle counting function $\tau(L,L+1)$ to be the total number of bits toggled in transitioning from L to L+1 (or vice-verse). For example, in the traditional binary representation, $\tau(3,4)=4$ since $3=0111_b$ and $4=1000_b$ differ in all four bit positions. It will also be useful to define the function $\phi(L,L+1)=\tau(L,L+1)/N$ which is the fraction of bits toggled in transitioning from level L to L+1. The bit error probability can be determined by using these functions.

By the definition of conditional probabilities and the independent error rates of each level, the total bit error probability can be expressed in terms of levels, L, as shown in Equation (2):

$$P(err_b) = \sum_{L=0}^{15} P(err_b | L)P(L) \quad (2)$$

Again applying the definition of conditional probabilities, Equation (2) can be further expanded in terms of errors occurring to the level above or below, as shown in Equation (3):

$$P(err_b) = P(L)\sum_{L=0}^{15} \left[P(err_b | L, \hat{L} = L - 1)P(\hat{L} = L - 1 | L) + \right. \quad (3)$$

$$\left. P(err_b | L, \hat{L} = L + 1)P(\hat{L} = L + 1 | L)\right]$$

The total bit error conditional probabilities in Equation (3) are in fact equal to the previously defined average bit toggle function, $\phi$. This can be understood by considering, for example, the first term $P(err_b \backslash L,\hat{L}=L-1)$. This expression means, "the probability of a bit error given the transmitter level is L and the received level, $\hat{L}$, is L−1". With the givens, a symbol error has occurred and the resulting probability will be ¼, 2/4 or ¾ depending on how many bits toggled erroneously (1, 2, or 3; respectively) due to detecting the level as L−1 vs. L. This is precisely the definition of $\phi$. Therefore, $$P(err_b \backslash L, \hat{L}=L-1)=\phi(L-1,L) \quad (4)$$

and $$P(err_b \backslash L, \hat{L}=L+1)=\phi(L,L+1) \quad (5)$$

Equations (4) and (5) can now be substituted into Equation (3), yielding Equation (6), as shown below:

$$P(err_b) = \quad (6)$$

$$P(L)\sum_{L=0}^{15} \left[\varphi(L-1,L)P(\hat{L} = L - 1 | L) + \varphi(L,L+1)P(\hat{L} = L + 1 | L)\right]$$

The bit error rate can now be expressed in terms of the symbol error rate by applying Equation (1), as shown below, to generate Equation (7):

$$P(err_b) = \frac{1}{2}P(err_S)P(L)\sum_{L=0}^{15} [\varphi(L - 1, L) + \varphi(L, L + 1)] \quad (7)$$

Since $\phi(-1,0)$ and $\phi(15,16)$ are zero, we can rewrite Equation (4) to provide the new Equation (8):

$$P(err_b) = \frac{1}{2}P(err_S)P(L)\sum_{L=0}^{14} 2\varphi(L, L + 1). \quad (8)$$

A bit of trivial simplification gives the desired result in Equation (9):

$$P(err_b) = P(err_S)\frac{1}{16}\sum_{L=0}^{14} \varphi(L, L+1) = P(err_S)\frac{1}{4*16}\sum_{L=0}^{14} \tau(L, L+1) \quad (9)$$

Thus, as previously mentioned, the bit error probability is approximately the symbol error probability scaled by the average number of fractional bit toggles as the binary representation is sequentially traversed. It is not exactly the average due to the normalization factor of 16 (instead of 15) where the inconsistency arises due to boundary effects at the ends of the sequence. The scale factor (i.e., the summation in Equation (9)) is a property of the code used to represent the symbols, and is minimized by Gray-codes where each summand is the minimum value of 1 (only 1 bit toggles per level transition).

The definitions of $\tau(L,L+1)$ and $\phi(L,L+1)$ may be adapted to also provide the bit error probability for a given bit X=A, B, C, or D. To do this, we simply define $$\tau_X(L, L+1) = \begin{cases} 0: \text{ if bit } X \text{ of } L \text{ and } L+1 \text{ are the same} \\ 1: \text{ if bit } X \text{ of } L \text{ and } L+1 \text{ are different} \end{cases} \quad (10)$$

Then, using $\tau_X$ in place of $\tau$ in Equation (9) gives the bit error probability for bit X, i.e., $P(err_{b=X})$. These values are tabulated in Table 2 for the conventional binary, conventional Gray, and Q-Gray codes.

TABLE 2

Normalized bit error rates for several exemplary coding examples.

| Code | Bit Error Rate (normalized to the symbol error rate) | | | | Total Bit Error Rate |
|---|---|---|---|---|---|
| | A | B | C | D | |
| Binary | 1/64 | 3/64 | 7/64 | 15/64 | 26/64 |
| Gray Code | 1/64 | 2/64 | 4/64 | 8/64 | 15/64 |
| Q-Gray Code | 3/64 | 4/64 | 4/64 | 4/64 | 15/64 |

From Table 2, it is seen that the Gray codes give a total bit error rate of somewhat better than 57% of a straight binary code. While the error rate analysis is present for N=4 bits, those skilled in the art will recognize that everything carries over to arbitrary values of N. In particular, Eq. (9) can be generalized to be $$P(err_b) = P(err_S) \frac{1}{M} \sum_{L=0}^{M-2} \varphi(L, L+1) = P(err_S) \frac{1}{N*M} \sum_{L=0}^{M-2} \tau(L, L+1) \quad (11)$$

where $M=2^N$ is the number of levels.

The distribution of bit errors within the individual bits (labeled A, B, C, and D) is almost ideally distributed by the use of the Q-Gray Code, thereby demonstrating a significant advantage over the conventional Gray Code. While this uniform distribution of the error over the bits is advantageous in that it eliminates the need for customized processing to account for skewed error rates, the largest benefit of this uniform distribution is that it allows for an improved realization of a flash ADC. In order to understand this benefit, the basic operation of each necessary bit decoder needs be explored.

The ADC is assumed a flash type converter with M−1=15 comparators (in the case of 16-level or 4-bit converters). These 15 comparators are referenced with 15 reference voltages that set the decision point between the expected symbol levels. Therefore, in general, they will be positioned mid-point (perhaps scaled according with the noise variances) between the ideal level voltages. Note that implementation of any of the exemplary codes will take M−1 comparators—this is a fundamental property of a flash converter.

A given bit decoder can be viewed as asserting its output based on the relationship of the input voltage as compared to the bit toggle thresholds required for a given bit. That is, if a given bit has say, for example four bit toggles, over the symbol input range, a four-input conventional odd-parity function gate connected to the appropriate four comparators is all of the hardware that's required to decode the bit.

Referring back to Table 1, we note that the numerator of each cell in the middle four columns is the summation shown below in Equation (12):

$$\sum_{L=0}^{M-2} \tau_X(L, L+1), \quad (12)$$

which counts the total number of times bit X is toggled as symbols are sequentially reversed. For example, bit A of traditional binary coding will only require a one-input odd-function gate (i.e. a buffer or no logic) to be the implemented. On the other hand, bit D of a traditional binary coding, will required a 15-input odd-function gate to bit decode—a large level of complexity that will undoubtedly be difficult to build at high speed. The traditional Gray code represents a significantly improved situation, but for example, bit D still requires an 8-input odd-function logic gate.

In contrast, the Q-Gray code has a minimum-maximum number of bit toggles per bit with 3 bits having 4 toggles and 1 bit having 3 toggles. Therefore, each bit requires at most a 4-input odd-parity logic gate for bit decoding. As will be seen below, a 4-input odd-parity gate can be implemented with 3 standard exclusive OR (XOR) gates.

Since the number of inputs to an odd-function gate will directly impact the gate's speed, the Q-Gray code represents a significant increase in ADC speed.

It is believed that the exemplary Q-Gray codes of the present invention are unique and that they exist for at least N=2, 3, 4, and 5 with larger searches being restricted by computer resources. In order to explore this further, the case of N=4 is considered in more detail, as shown in Table 3.

TABLE 3

Exemplary 4-bit Q-Gray Code.

| Level | Bit | | | |
|---|---|---|---|---|
| | A | B | C | D |
| 0 | 1 | 0 | 0 | 0 |
| 1 | 1 | 0 | 1 | 0 |
| 2 | 1 | 1 | 1 | 0 |
| 3 | 1 | 1 | 0 | 0 |
| 4 | 0 | 1 | 0 | 0 |
| 5 | 0 | 1 | 0 | 1 |
| 6 | 1 | 1 | 0 | 1 |
| 7 | 1 | 0 | 0 | 1 |
| 8 | 1 | 0 | 1 | 1 |
| 9 | 1 | 1 | 1 | 1 |
| 10 | 0 | 1 | 1 | 1 |
| 11 | 0 | 1 | 1 | 0 |
| 12 | 0 | 0 | 1 | 0 |
| 13 | 0 | 0 | 1 | 1 |
| 14 | 0 | 0 | 0 | 1 |
| 15 | 0 | 0 | 0 | 0 |

The search for a Q-Gray code can be a very challenging endeavor if done by brute force. The 16 values of an N=4 (4 bit word) can be selected in 16 factorial ways (20,922,789, 888,000 possibilities), which is a somewhat restrictively large number for a computer search unless care is taken with the search algorithm used.

For example, if 10 million candidates are tested per second (optimistic workstation search speed), it would still take 24 days for even this simple N=4 search to complete. Fortunately, if the problem is cast into the underlying bit transition operator lists (BTOL's), there are only $4^{15}$ possible trial lists (1,073,741,824 possibilities).

A BTOL is a list of sequential bit transition operations required to produce a valid Gray code. A BTOL inverts the indicated bit of the binary word. In particular, if the $K^{th}$ element of the list is bit A, then that means the binary representation of the decimal number K is obtained by taking the binary representation of K−1 and inverting the "A" bit (and similarly for the other bits). If a list results in a non-repeating sequence of binary words, it represents a valid Gray code.

Furthermore, the resulting sequence of binary words represents a Gray code regardless of the seed word. Because Gray codes are produced by BTOL's, one can search among valid BTOL's (instead of the much larger set of sequences of binary words) for a Q-Gray code as previously stated. This search could be significantly further reduced by symmetry arguments and other simple rules, but this is a manageable search space for low-end computers and was selected as the starting point.

A computer search resulted in 5712 BTOL's that produce Gray codes. These operator lists can be "seeded" with 16 possible starting levels (represents all possible bit inversions) plus 4! ways to arrange the bit columns, resulting in a total number of "Gray" codes of 2,193,408.

This list of 5712 possibilities was further filtered to find desired "optimal" Q-Gray codes which minimize the maximum number of transitions per bit. There must be 15 transitions total that are divided between the 4 bits. This results in the optimal number of transitions per bit being 4 with one bit having 3. This search resulted in 384 operator sequences.

These 384 sequences were all observed to be based on a single basic bit-transition operator sequence:

CBCADABCBADBDCD  (13)

and with operator A returning the original "seed" from the last element in the resulting code. The sequence in Eq. 13 produces the Q-Gray code listed in Table 3 when a seed of "1000" is used.

Since any column operator can be interchanged with another, and the sequence can be started at any position, the total number of sequences is 4!*16=384, which is correctly identical to the search result. Note that the sequence can be reversed, but in fact, reversal of the sequence only makes the sequence with a bit interchanged (therefore accounted for in the 4! term). Finally, since again, there are 16 possible seeds for the operator lists, there are a total of 384*16=6,144 rather good Q-Gray code sequences. It appears that all 6,144 of these possible codes are unique, but are really just forms of one another.

The N=2 case is trivial as the only Gray Code is a Q-Gray code. Additional computer searches found Q-Gray codes for the 3 and 5 bit (8 and 32 level) resolutions. The exemplary Q-Gray code for the N=3 bit case is given by the BTOL:

ABCBABC    (14)

with operator B returning the original seed from the last word in the code. Table 4 gives the Q-Gray code resulting from this BTOL when a binary seed value of "000" is used.

The exemplary Q-Gray code for the N=5 bit case is given by the BTOL:

ABACABADABEBDCDEBEDCACDECEBDCDE    (15)

with operator D returning the original seed from the last word in the code. Table 5 gives the Q-Gray code resulting from this BTOL when a binary seed value of "00000" is used.

It is believed that a Q-Gray code exists for higher resolutions (N>5) but are limited in search due to finite computer resources (the brute force search scales by $(2^N)!$, which quickly explodes and other methods also scale poorly). Further, additional unique Q-Gray codes for each of the three bit, four bit, and five bit examples discussed above can be derived by cyclically rotating the bit translation operating list to yield alternate and inventive Q-Gray codes. Similarly, additional unique Q-Gray codes can be derived from the three, four, and five bit examples mentioned above by interchanging bit channel assignments.

TABLE 4

Exemplary 3-bit Q-Gray Code

| Level | Bit | | |
|---|---|---|---|
| | A | B | C |
| 0 | 0 | 0 | 0 |
| 1 | 1 | 0 | 0 |
| 2 | 1 | 1 | 0 |
| 3 | 1 | 1 | 1 |
| 4 | 1 | 0 | 1 |
| 5 | 0 | 0 | 1 |
| 6 | 0 | 1 | 1 |
| 7 | 0 | 1 | 0 |

TABLE 5

Exemplary 5-bit Q-Gray Code.

| Level | Bit | | | | |
|---|---|---|---|---|---|
| | A | B | C | D | E |
| 0 | 0 | 0 | 0 | 0 | 0 |
| 1 | 1 | 0 | 0 | 0 | 0 |
| 2 | 1 | 1 | 0 | 0 | 0 |
| 3 | 0 | 1 | 0 | 0 | 0 |
| 4 | 0 | 1 | 1 | 0 | 0 |
| 5 | 1 | 1 | 1 | 0 | 0 |
| 6 | 1 | 0 | 1 | 0 | 0 |
| 7 | 0 | 0 | 1 | 0 | 0 |
| 8 | 0 | 0 | 1 | 1 | 0 |
| 9 | 1 | 0 | 1 | 1 | 0 |
| 10 | 1 | 1 | 1 | 1 | 0 |
| 11 | 1 | 1 | 1 | 1 | 1 |
| 12 | 1 | 0 | 1 | 1 | 1 |
| 13 | 1 | 0 | 1 | 0 | 1 |
| 14 | 1 | 0 | 0 | 0 | 1 |
| 15 | 1 | 0 | 0 | 1 | 1 |
| 16 | 1 | 0 | 0 | 1 | 0 |
| 17 | 1 | 1 | 0 | 1 | 0 |
| 18 | 1 | 1 | 0 | 1 | 1 |
| 19 | 1 | 1 | 0 | 0 | 1 |
| 20 | 1 | 1 | 1 | 0 | 1 |
| 21 | 0 | 1 | 1 | 0 | 1 |
| 22 | 0 | 1 | 0 | 0 | 1 |
| 23 | 0 | 1 | 0 | 1 | 1 |
| 24 | 0 | 1 | 0 | 1 | 0 |
| 25 | 0 | 1 | 1 | 1 | 0 |
| 26 | 0 | 1 | 1 | 1 | 1 |
| 27 | 0 | 0 | 1 | 1 | 1 |
| 28 | 0 | 0 | 1 | 0 | 1 |
| 29 | 0 | 0 | 0 | 0 | 1 |
| 30 | 0 | 0 | 0 | 1 | 1 |
| 31 | 0 | 0 | 0 | 1 | 0 |

Exemplary embodiments of the present invention will hereinafter be described with reference to the drawings, in which like numerals represent like elements throughout the several figures.

An exemplary embodiment of a 4-bit ADC 100 based on the Q-Gray code in Table 3 is illustrated in FIG. 1A. FIG. 1A is a block diagram of a flash converter 100 with the normal $2^N-1$ (=15) input comparators 105 with threshold voltages (labeled $Vr_i$) set between the expected input symbol levels. It is noted that conventional flash ADC's use thresholds that are uniformly spaced in a set decoding range.

The present invention, in contrast, allows fully independent and externally adjustable control of the threshold voltages $Vr_i$. This flexibility provides more freedom in the signal decoding. Such flexibility is needed in communication settings where one has signal dependent noise or distortions and the optimal decoding thresholds are not uniformly spaced.

The comparator outputs are appropriately routed to the necessary bit decoders 110 of decoder blocks 120 to realize the desired coding. The decoder blocks 120 further comprise latches 115. Because the Q-Gray code of this exemplary embodiment is a Gray code, each comparator only drives one decoder input. This one-to-one assignment results in low gate loading and hence high speed as with all Gray-coded converters.

The one-to-one assignment between comparator outputs and decoder inputs is directly obtained from the BTOL and seed word for the Gray code. In particular, the inputs to a parity-detection decoder block 110 are (i) the comparator outputs corresponding to the list locations of the bit in the BTOL and (ii) the seed value for that bit.

Since the exemplary ADC 100 of FIG. 1A uses the Q-Gray code, the 4 necessary bit decoders 110 are simple 4-input odd-parity functions as discussed above. And as previously stated, the inputs to the decoders 110 are taken from the BTOL and seed value.

For example, the A-bit decoder 110A takes as inputs logical 1 (from the seed value) and comparator outputs Vc4, Vc6, and Vc10 since A occurs in the BTOL sequence in Eq. 13 at the fourth, sixth, and tenth positions. Similarly, the B-bit decoder 110B takes Vc2, Vc7, Vc9, and Vc12 as inputs because the B operator occurs in the second, seventh, ninth, and twelfth positions in the BTOL in Eq. 13.

Furthermore, because the seed value is "0" for the B-bit in Table 4, it is unnecessary to provide this input to the odd-parity decoder block. Input assignments for the C and D-bit decoders 110C, 110D are similarly obtained from the BTOL. The 4 outputs of the bit decoders 110 are finally latched by the clock signal at a desired sample time.

The distribution of toggles as the code is traversed (i.e. the number of occurrences of a bit operator in the BTOL) directly impacts the structure of any Gray code decoder. The advantage of the even bit error distribution provided by the Q-gray code of the present invention can now be explained.

The complexity of a decoder circuit is determined by the number of gates in the circuit which increases linearly with respect to the number of inputs to the parity detection circuit. Furthermore, buffers must to added to the simpler decoder blocks 120 to match the overall delay to the slowest decoder block (i.e. the one with the most inputs).

Thus, to minimize aggregate decoder complexity, it is desirable to minimize the largest number of inputs to any given decoder block. In other words, it is desirable to have an even distribution of inputs to each decoder block 120. This is precisely what the Q-Gray code allows. Therefore, the Q-Gray code provides a means for minimal decoder circuit complexity which reduces dissipated power and increases achievable operational speeds.

Figure 1B:
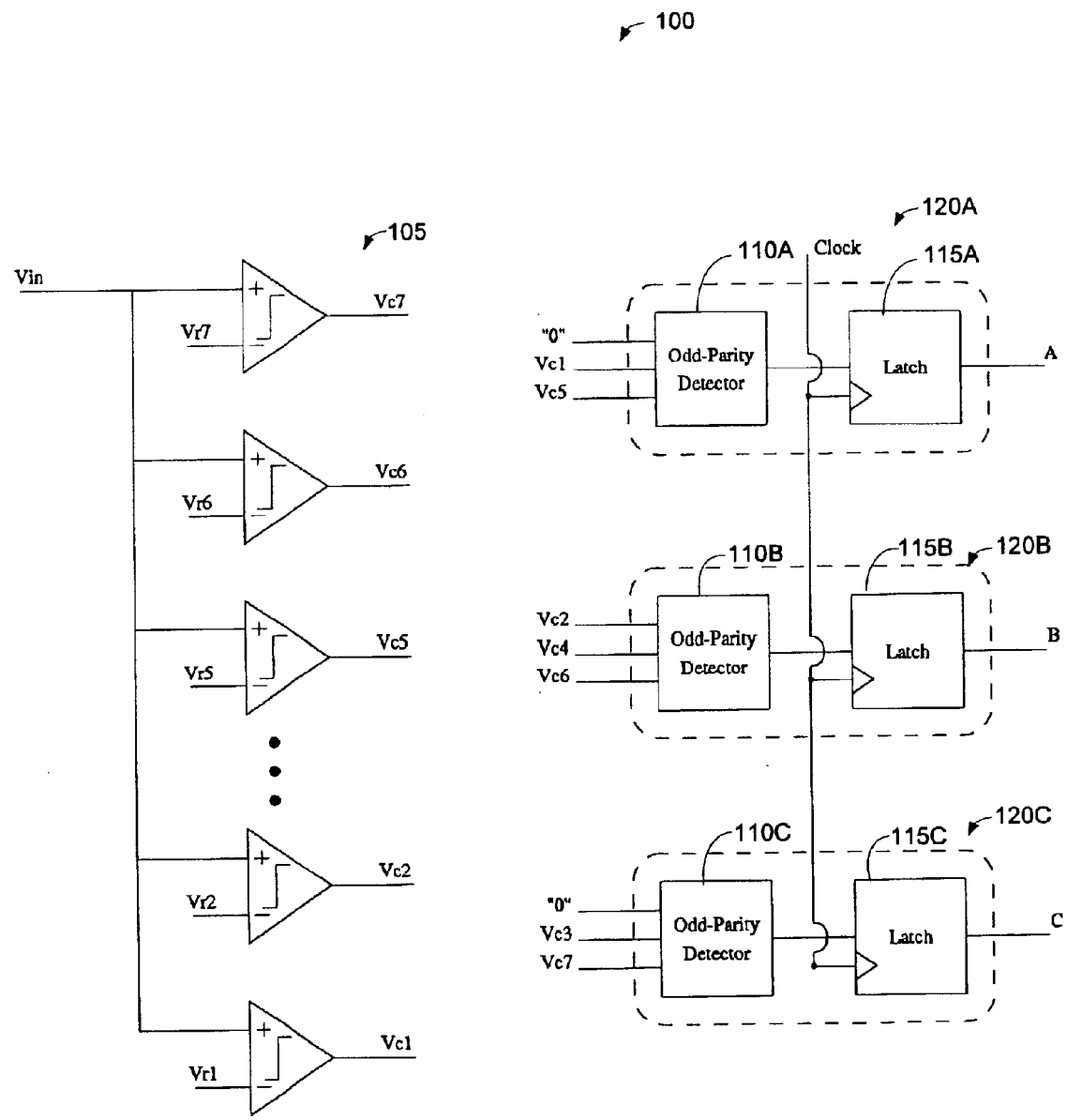
FIG. 1B is a block diagram of an exemplary 3-bit ADC according to one exemplary embodiment of the present invention.
Figure 1C:
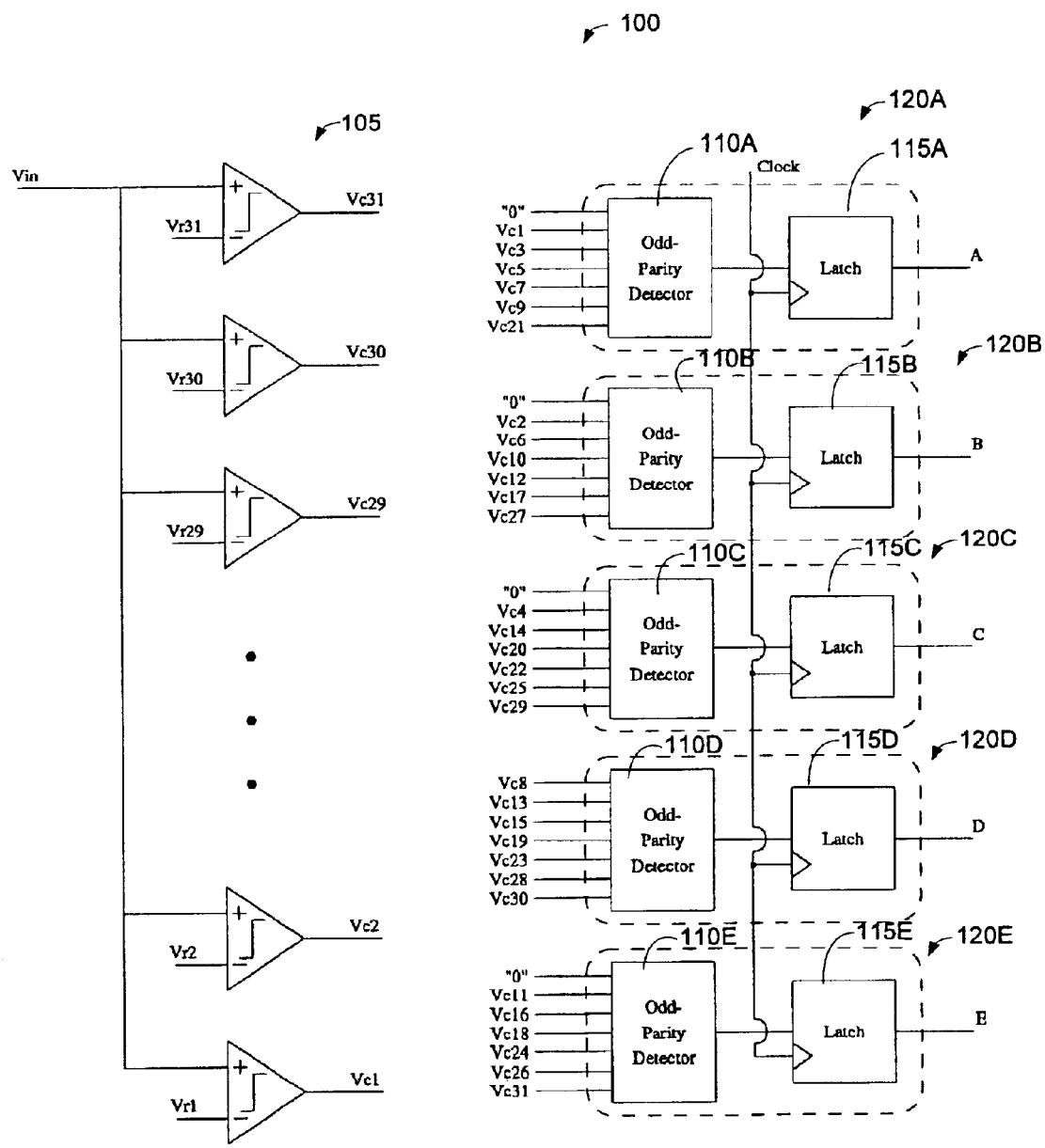
FIG. 1C is a block diagram of an exemplary 5-bit ADC according to one exemplary embodiment of the present invention.

FIGS. 1B and 1C illustrate exemplary embodiments for ADC's based on the 3-bit Q-Gray code (based on the BTOL in Eq. 14) and the 5-bit Q-Gray code (based on the BTOL in Eq. 15), respectively. Specifically, in FIG. 1B, the A-bit decoder 110A takes as inputs logical "0" (from the seed value) and comparator outputs Vc1 and Vc5 since A occurs in the BTOL sequence in Eq. 14 at the first and fifth positions. Similarly, in FIG. 1C, the A-bit decoder 110A takes as inputs logical "0" (from the seed value) and comparator outputs Vc1, Vc3, Vc5, Vc7, Vc9, and Vc21 since A occurs in the BTOL sequence in Eq. 15 at the first, third, fifth, seventh, ninth, and twenty-first positions.

Figure 1D:
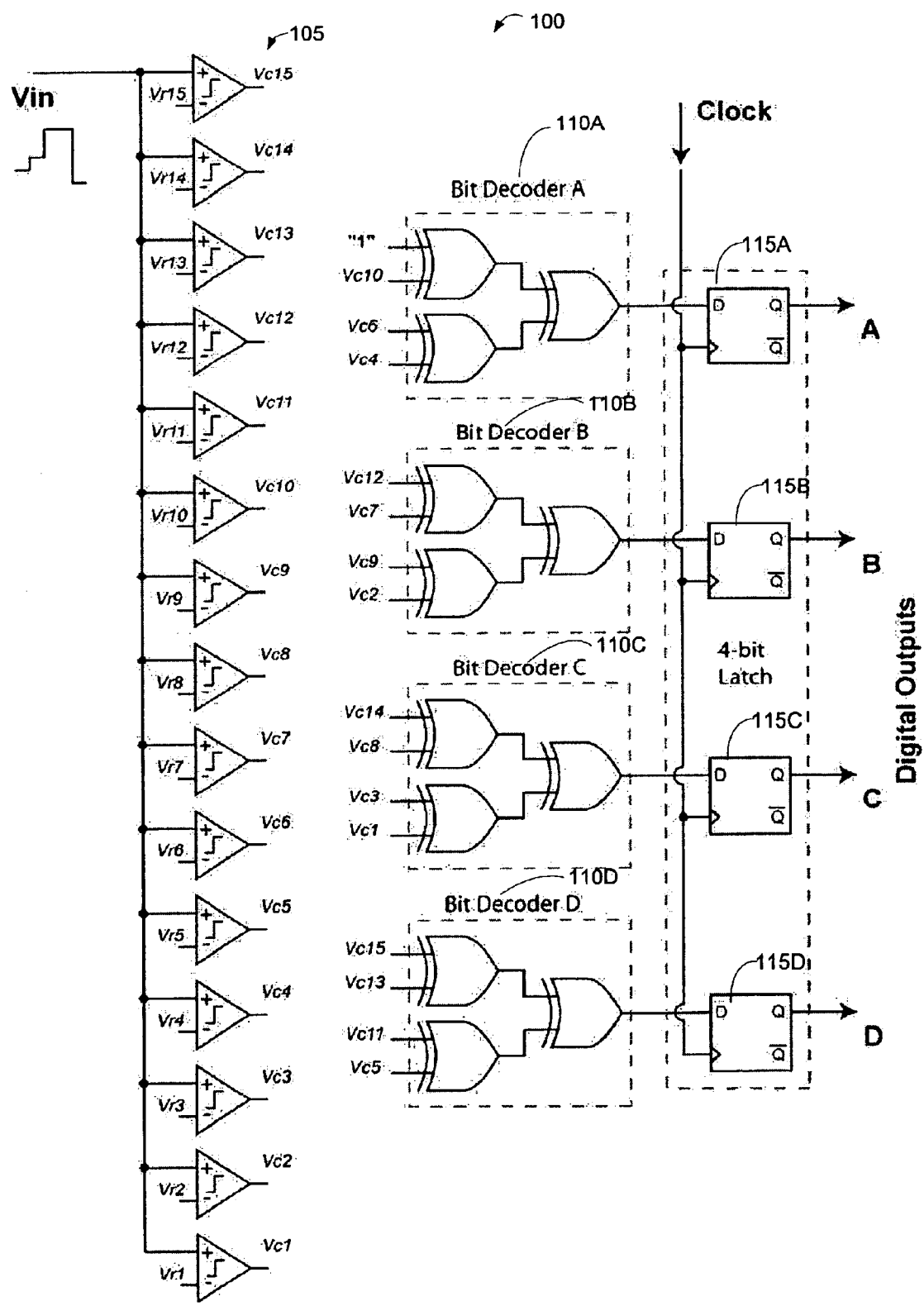
FIG. 1D is a block diagram of an exemplary 4-bit ADC according to one exemplary embodiment of the present invention.

Referring now to FIG. 1D, this Figure illustrates a more specific realization of FIG. 1A. In particular, it shows how the 4-input odd-parity functions are realized by using 3 XOR gates. The exemplary ADC circuit 100 illustrated in FIG. 1D has been realized in a 2 $\mu$m GaAs HBT process and has been verified to be fully operational.

The circuit blocks used in FIG. 1D can be implemented in a variety of circuit technologies and by a variety of design techniques by one skilled-in-the-art. One-skilled-in-the-art will realize that ADC's 100 with other bit resolutions can be similarly implemented in view of the teachings presented herein and the present art.

Another advantage of a Q-Gray code-based ADC is apparent from FIGS. 1A, 1B, and 1C. The decoder blocks 120 (i.e. odd-parity detector 110 followed by a latch 115 enclosed in a dashed box) are identical for each of the bits. The only difference is in the inputs assigned to each odd-parity detector. Thus, a single and simple decoder circuit can be designed, which can then be replicated for the other bit decoder blocks 120. This is in contrast to ADC's based on the conventional Gray code where each decoder block must be separately designed due to the high variation in the number of inputs to each block.

Figure 2:
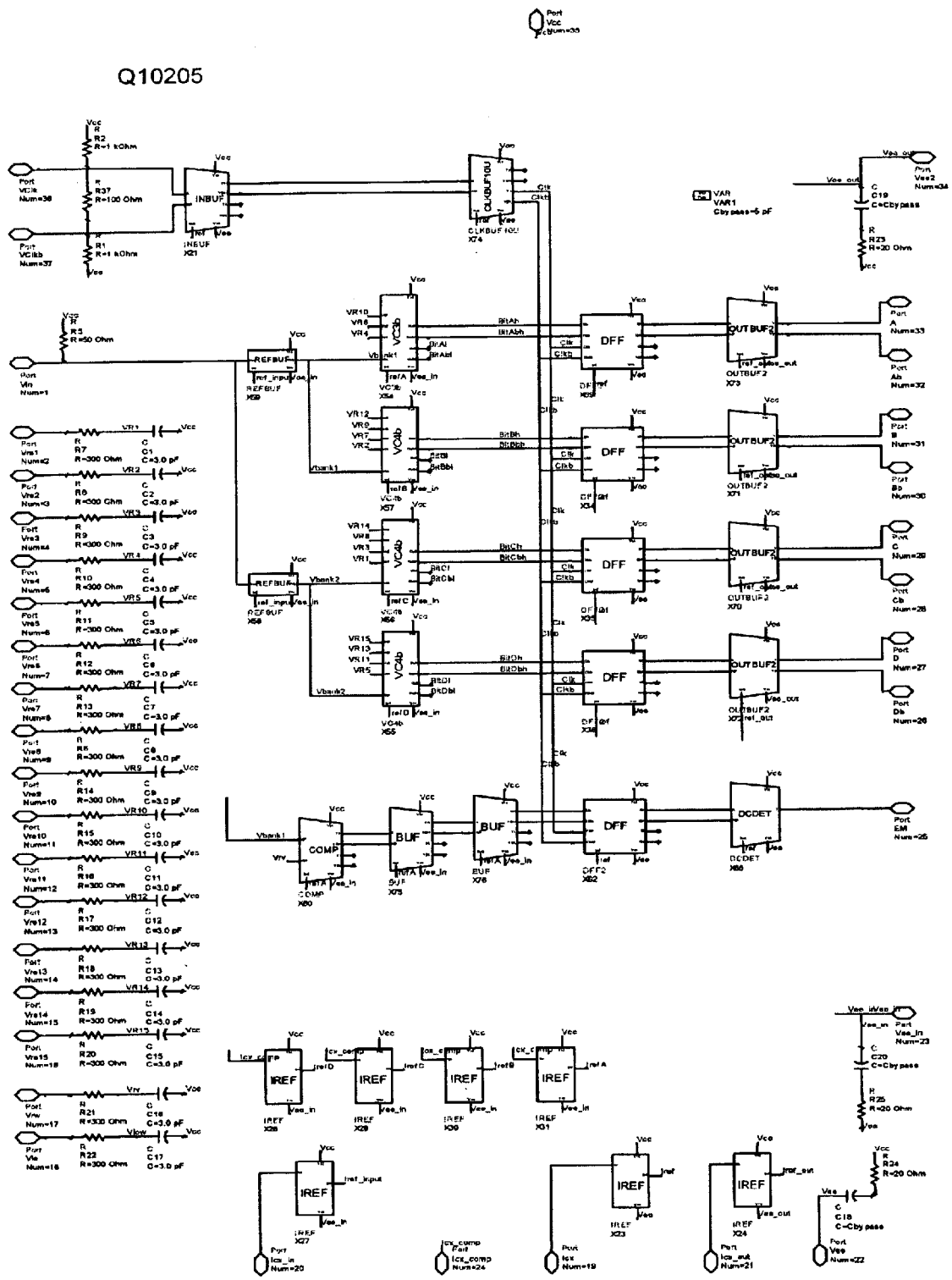
FIG. 2 is a top-level schematic circuit for the 4-bit ADC shown in FIG. 1D according to one exemplary embodiment of the present invention.

Referring now to FIG. 2, this Figure illustrate a top-level schematic diagram of the exemplary ADC 100 shown in FIG. 1D. Comparing this schematic to the block diagram of FIG. 1D, it can be seen that the Vr1 to Vr15 comparator reference inputs of FIG. 1D correspond to the Vre1 to Vre15 comparator inputs on the left-hand side of the schematic shown in FIG. 2.

And the bit decoders and the associated comparators are absorbed within the circuit blocks labeled VC4b and VC3b. The voltage input is labeled Vin and is first buffered by the two buffering amplifiers, REFBUF (X58 and X59) circuit, before being routed to the comparator array, which is included within the VC3b and VC4b circuits (X54 through X57).

The outputs of the VC blocks are latched using 4 D-type flip-flop (DFF) circuit blocks. The latched outputs are then buffered to 50 $\Omega$ output impedance by a circuit block named OUTBUF2. One skilled in the art will realize that the functions of the DFF, BUF, INBUF, CLKBUF10U, DCDET, and OUTBUF2 circuit blocks can be realized in a variety of forms and representative circuit embodiments.

Figure 3:
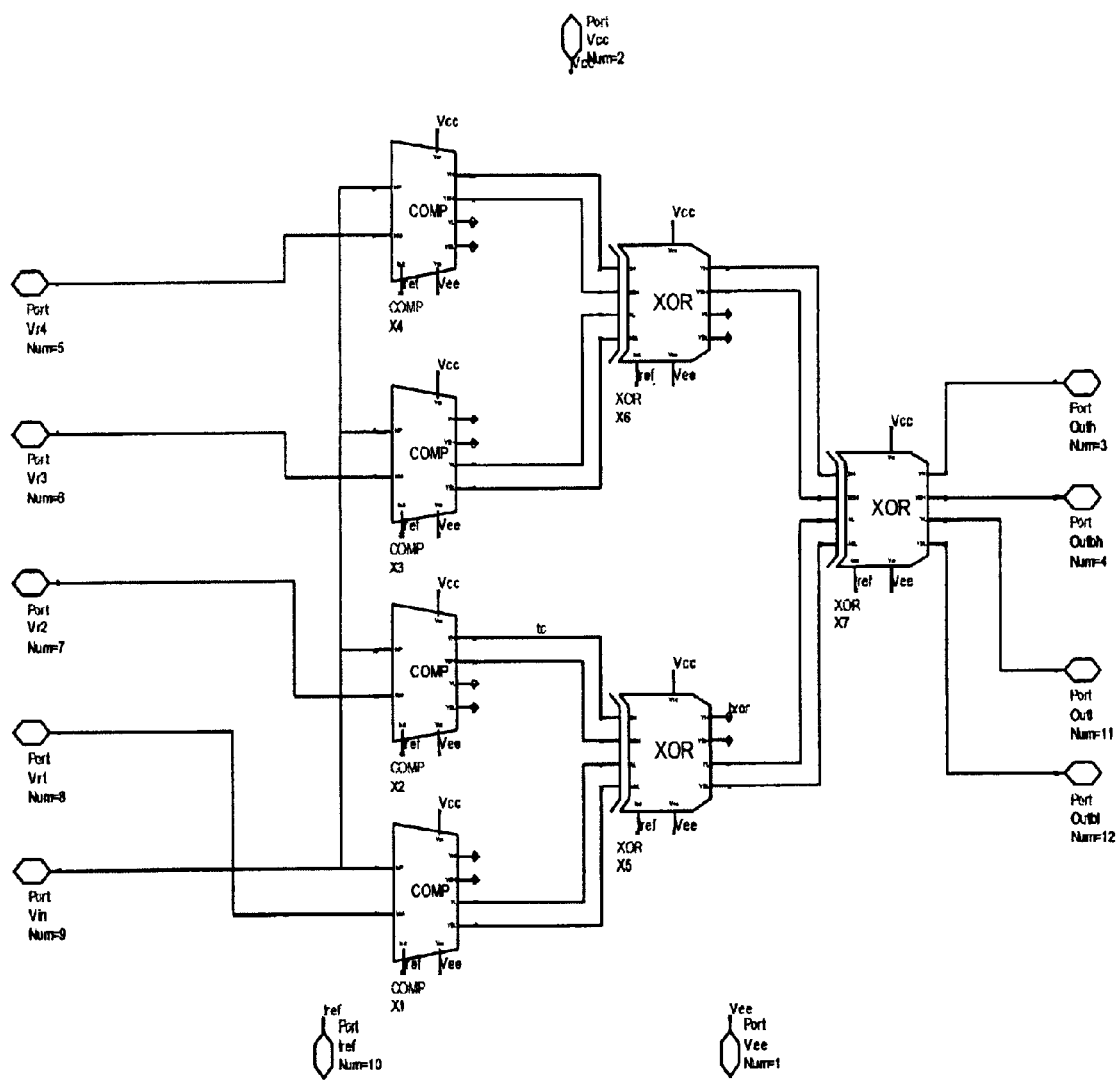
FIG. 3 is a schematic circuit diagram of the VC4b block of FIG. 2 according to one exemplary embodiment of the present invention.

Referring now to FIG. 3, this Figure illustrates the VC4b circuit that comprises four comparators, COMP (X1 through X4), and three exclusive-OR gates, XOR (X5 through X7). The VC circuits include the bit decoder and corresponding comparators, as required in FIG. 1D, to determine a given bit's value.

Figure 4:
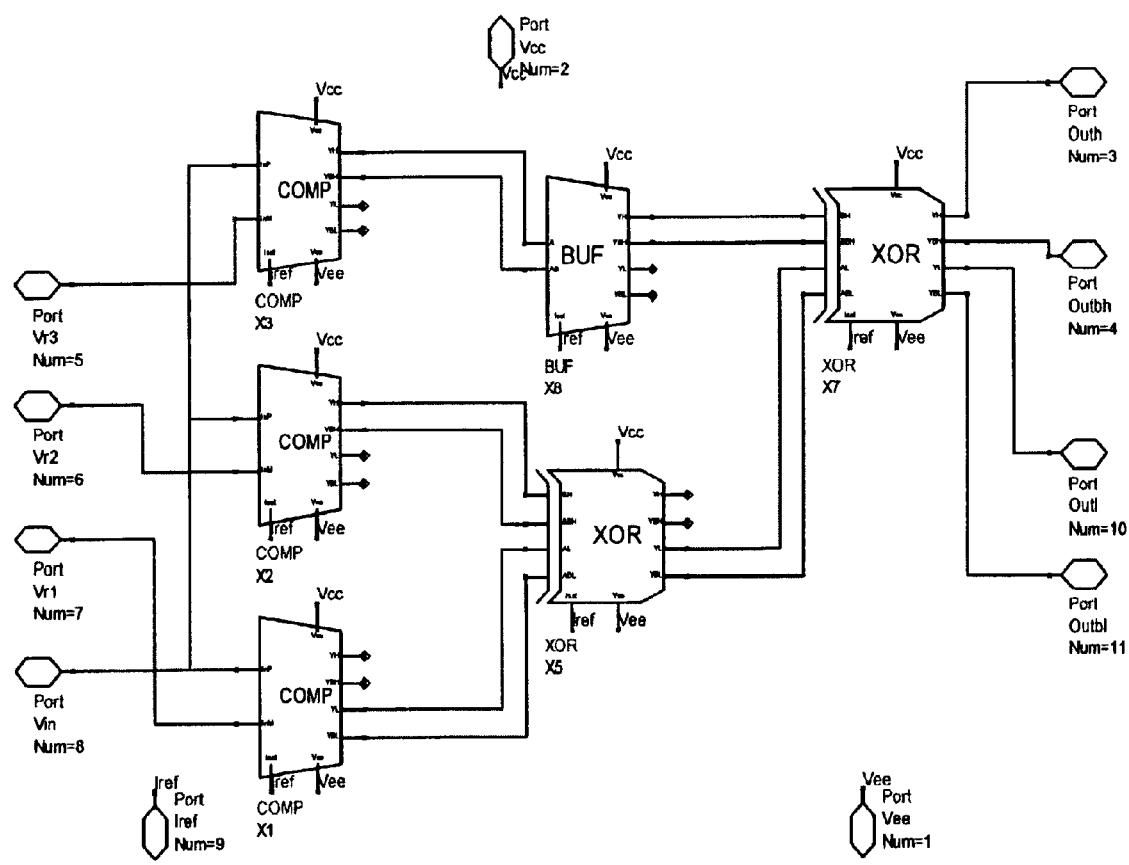
FIG. 4 is a schematic circuit diagram of the VC3b block of FIG. 2 according to one exemplary embodiment of the present invention.
Figure 5:
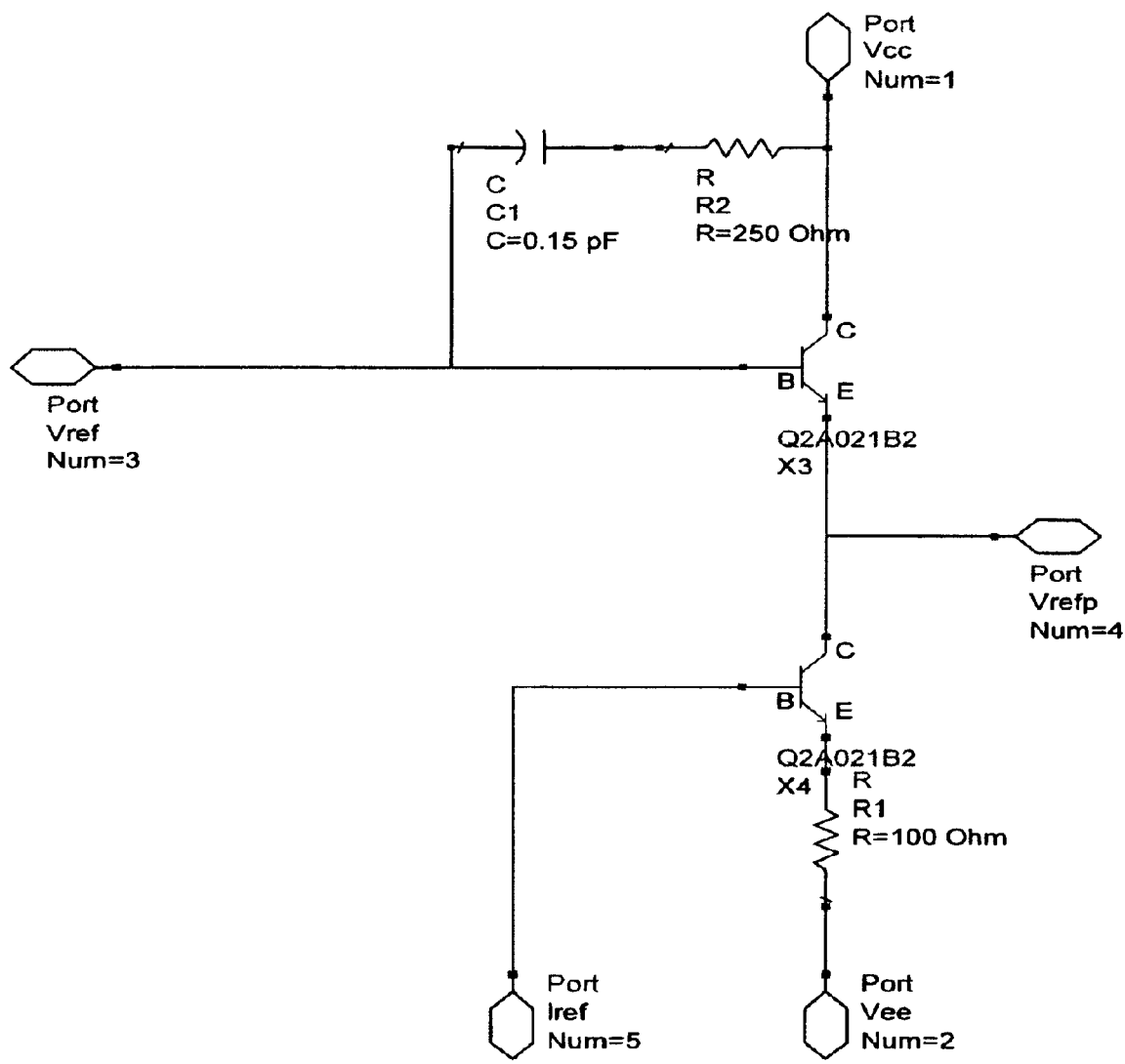
FIG. 5 is a schematic circuit diagram of the input buffer, REFBUF, of FIG. 2 according to one exemplary embodiment of the present invention.
Figure 6:
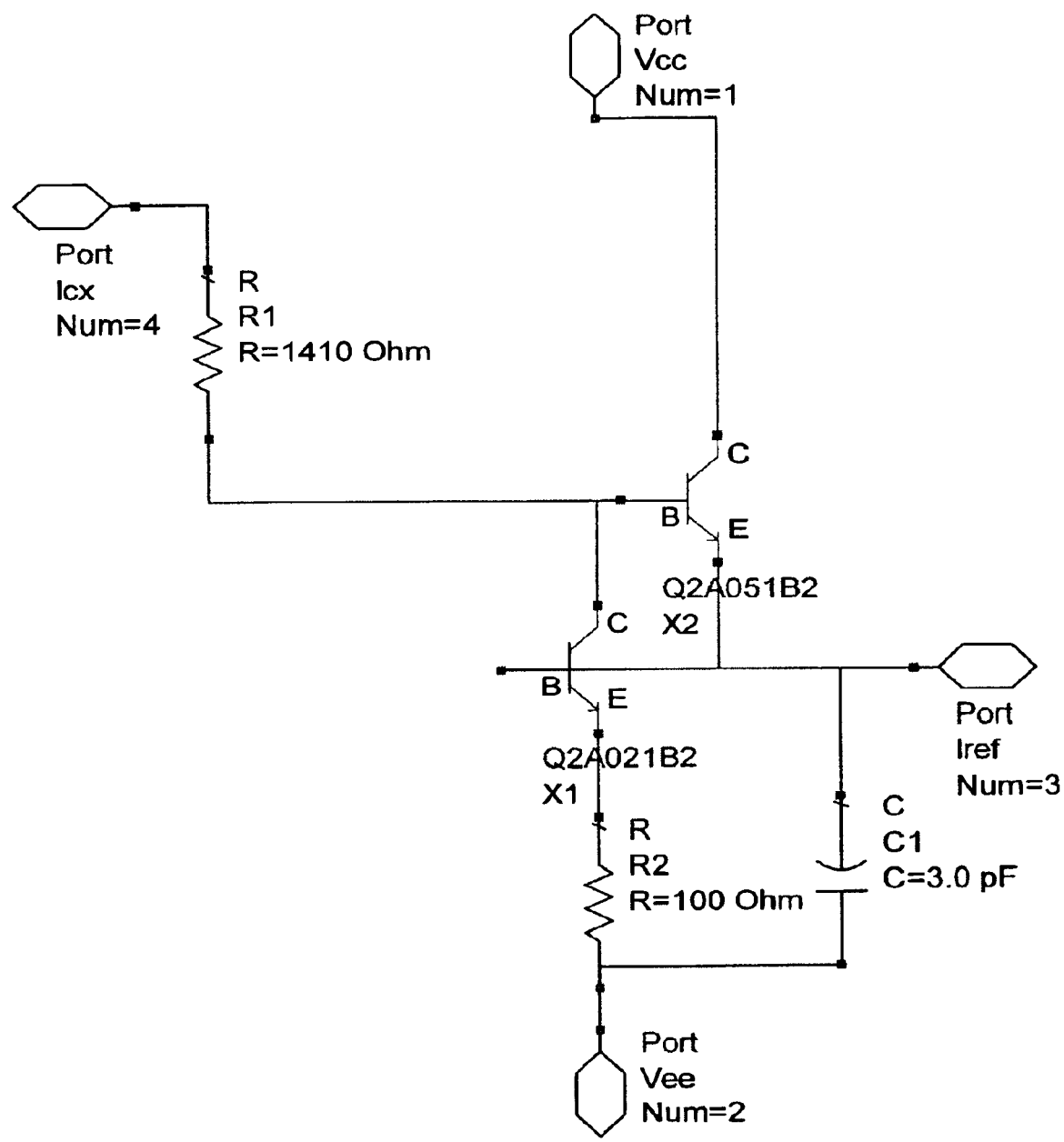
FIG. 6 is a schematic circuit diagram of the IREF circuit block of FIG. 2 according to one exemplary embodiment of the present invention.
Figure 7:
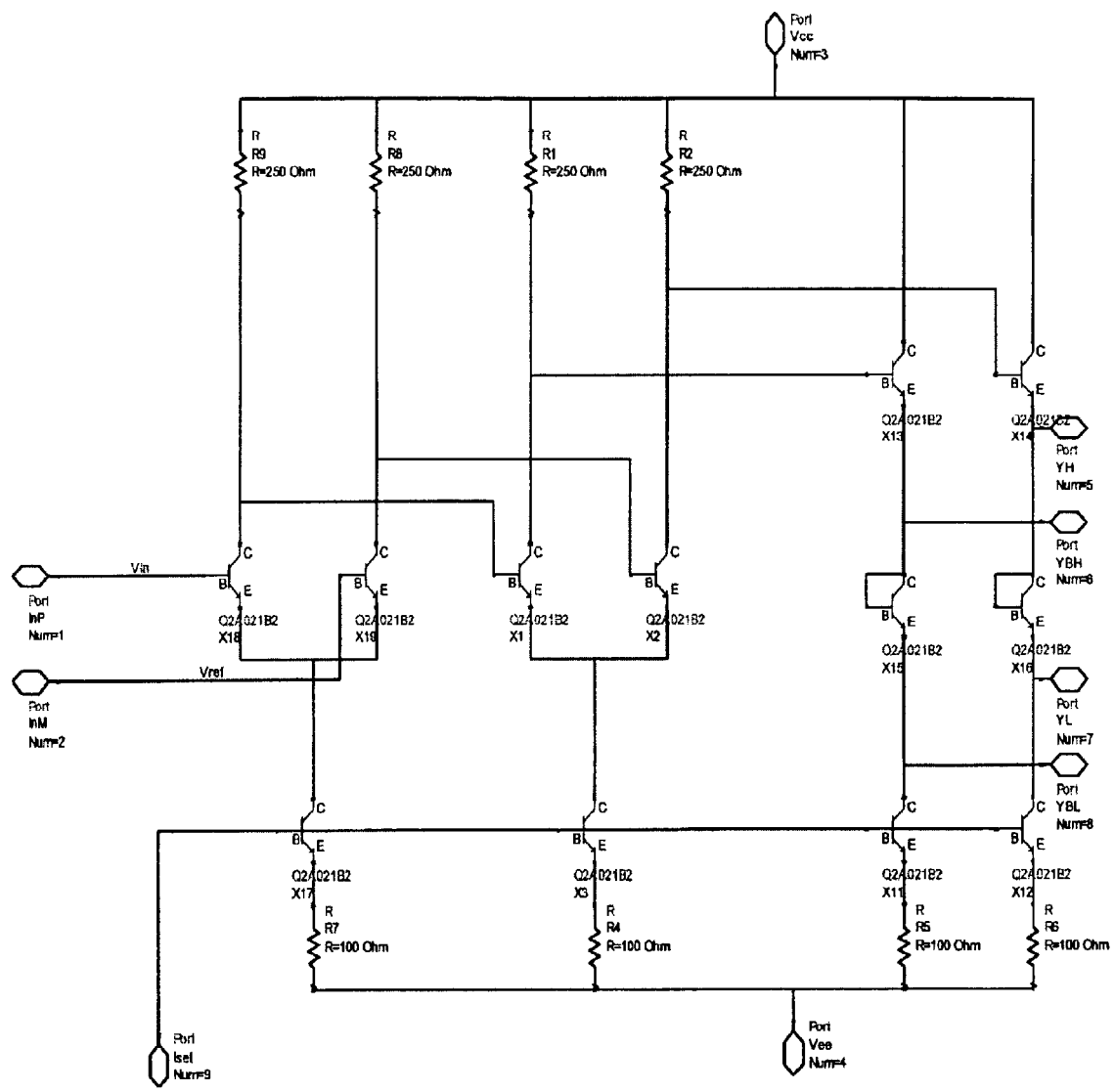
FIG. 7 is a schematic circuit diagram of the comparator block, COMP, of FIG. 3 and FIG. 4 according to one exemplary embodiment of the present invention.

Referring briefly to FIG. 4, this Figure illustrates a simplified VC circuit. Referring to FIG. 5, this Figure illustrates the REFBUF circuit that comprises an emitter follower amplifier. FIG. 6 illustrates the IREF circuit used to bias the other circuits. And FIG. 7 illustrates the circuit diagram of the comparator (COMP) circuit. Bit A has only three bit toggles and therefore a simplified VC circuit as shown in FIG. 4 was used.

Figure 8:
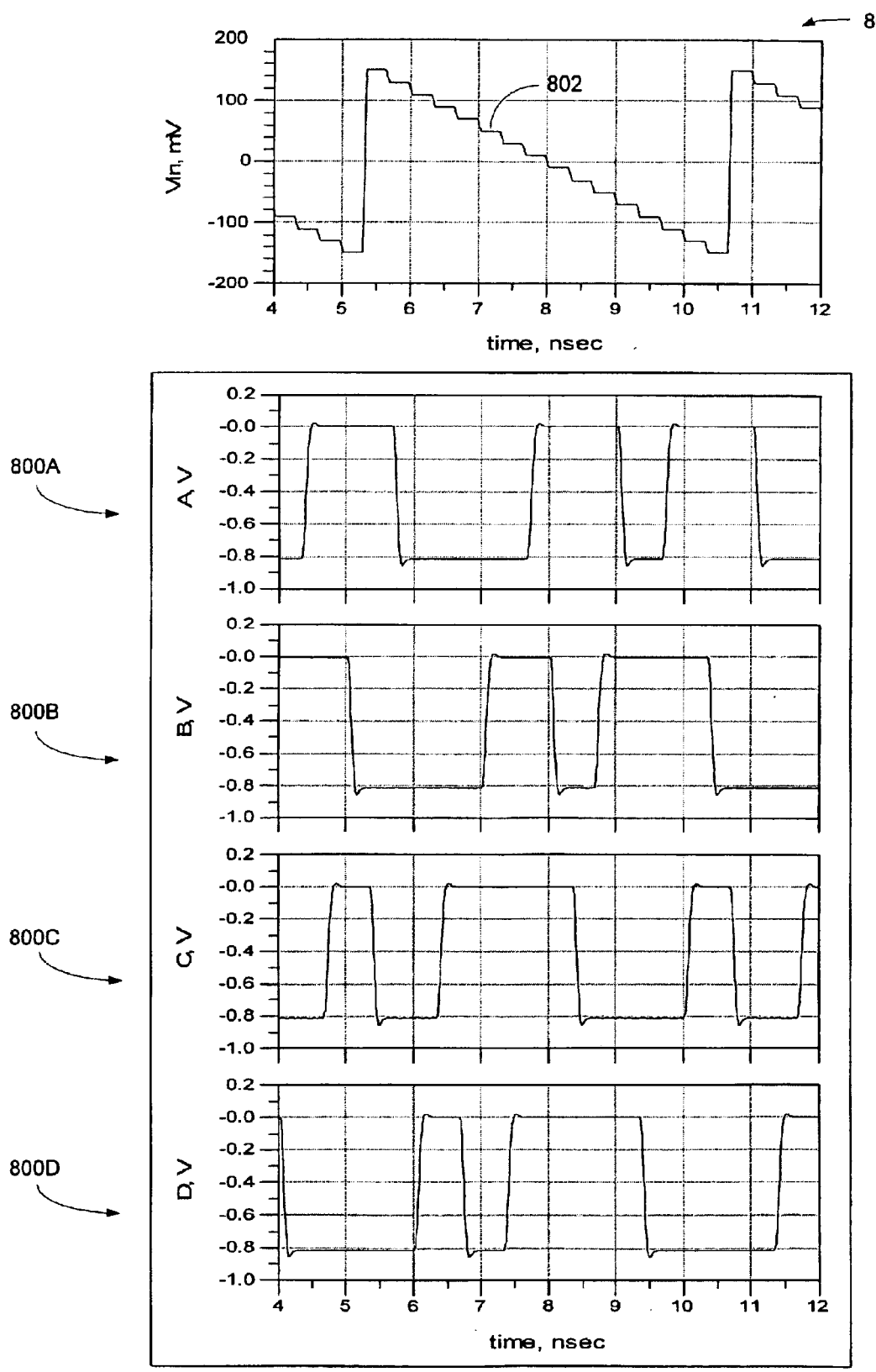
FIG. 8 is a graphical depiction of the simulation results for the exemplary 4-bit ADC shown in FIG. 2 according to one exemplary embodiment of the present invention.

FIG. 8 illustrates a simulation result for the exemplary ADC circuit of FIG. 2. The input signal 802 is the trace labeled Vin at the top of the first graph 804. The top most level corresponds to level 15 of Table 3 and the lowest voltage level corresponds to level 0. A careful inspection of the outputs A, B, C, and D illustrated in Graphs 800A, 800B, 800C, and 800D demonstrate that the ADC's operation exactly matches the codes of Table 3 (notwithstanding the output delay of one symbol period, i.e. 333 ps), as desired.

It should be understood that the foregoing relates only to illustrative embodiments of the present invention, and that numerous changes may be made therein without departing from the spirit and scope of the invention as defined by the following claims.

What is claimed is:

1. An analog to digital converter comprising:
    a plurality of comparators for receiving a multilevel signal generated according to a code for which the maximum number of bit-toggles incurred in a bit channel while sequentially traversing the code is minimized;
    a plurality of decoder blocks coupled to comparators for decoding the multilevel signal, wherein each decoder block comprises an equal number of inputs, whereby the analog to digital converter has a design that reduces dissipated power and increases achievable operational speeds for communications.

2. The analog to digital converter of claim 1, wherein the comparators can process a multilevel signal comprising non-uniformly spaced decoding thresholds.

3. The analog to digital converter of claim 1, wherein the multilevel signal is decoded into bit channels for which the bit error rates are substantially evenly distributed.

4. The analog to digital converter of claim 1, wherein each decoder block comprises a parity detector with an equal number of inputs.

5. The analog to digital converter of claim 1, wherein each decoder block comprises a bank of identical parity detectors relative to another decoder block.

6. The analog to digital converter of claim 1, wherein each comparator has an individually adjustable threshold level.

7. The analog to digital converter of claim 1, wherein each comparator has an externally controllable threshold level.

8. An analog to digital converter comprising:
   a plurality of comparators with adjustable thresholds for receiving a multilevel signal;
   a plurality of decoder blocks coupled to the comparators for decoding the multilevel signal, wherein each decoder block comprises a plurality of identical parity detectors relative to another decoder block, whereby the analog to digital converter has a design that reduces dissipated power and increases communication speed.

9. The analog to digital converter of claim 8, wherein the multilevel signal is decoded into bit channels for which the bit error rates are substantially evenly distributed.

10. The analog to digital converter of claim 8, wherein the multilevel signal is decoded according to a code for which the maximum number of bit-toggles incurred in a bit channel while sequentially traversing the code is minimized.

11. The analog to digital converter of claim 8, wherein each decoder block comprises an equal number of inputs.

12. The analog to digital converter of claim 8, wherein each parity detector has an equal number of inputs.

13. The analog to digital converter of claim 8, wherein each comparator has an individually adjustable threshold level.

14. The analog to digital converter of claim 8, wherein each comparator has an externally controllable threshold level.

15. An analog to digital converter comprising:
    a plurality of comparators for receiving a multilevel signal generated by a code for which the bit error rate is substantially evenly distributed across each bit channel when decoded;
    a plurality of decoder blocks coupled to the comparators for decoding the multilevel signal, wherein each decoder block comprises an equal number of parity detectors, whereby the analog to digital converter reduces power consumption.

16. The analog to digital converter of claim 15, wherein the comparators can process a multilevel signal comprising non-uniformly spaced decoding thresholds.

17. The analog to digital converter of claim 15, wherein the multilevel signal is decoded according to a code for which the maximum number of bit-toggles incurred in a bit channel while sequentially traversing the code is minimized.

18. The analog to digital converter of claim 15, wherein each decoder block comprises an equal number of inputs.

19. The analog to digital converter of claim 15, wherein each parity detector has an equal number of inputs.

20. The analog to digital converter of claim 15, wherein each comparator has an individually adjustable threshold level.

21. The analog to digital converter of claim 15, wherein each comparator has an externally controllable threshold level.

22. An analog to digital converter comprising:
    a plurality of comparators for receiving a multilevel signal, each comparator having an individually adjustable threshold level;
    a plurality of decoder blocks coupled to the comparators for decoding the multilevel signal, wherein each decoder block comprises identical hardware relative to another decoder block, whereby the analog to digital converter has a design that increases communication speeds.

23. The analog to digital converter of claim 22, wherein the multilevel signal is decoded according to a code for which the maximum number of bit-toggles incurred in a bit channel while sequentially traversing the code is minimized.

24. The analog to digital converter of claim 22, wherein the comparators can process a multilevel signal comprising non-uniformly spaced decoding thresholds.

25. The analog to digital converter of claim 22, wherein the hardware comprises parity detectors.

26. The analog to digital converter of claim 25, wherein each parity detector has an equal number of inputs.

27. The analog to digital converter of claim 22, wherein each decoder block comprises an equal number of inputs.

28. The analog to digital converter of claim 22, wherein each comparator has an externally controllable threshold level.

29. The analog to digital converter of claim 22, wherein inputs are evenly distributed to each decoder block.

30. An analog to digital converter comprising:
    a plurality of comparators for receiving a multilevel signal generated according to a three bit Gray code derived from a bit translation operating list comprising ABCBABC with an operator comprising B and the operator returning an original seed from a last word in the three bit Gray code;
    a plurality of decoder blocks coupled to comparators for decoding the multilevel signal, wherein each decoder block comprises an equal number of inputs.

31. The analog to digital converter of claim 30, wherein the code producing the multilevel signal is further derived by cyclically rotating the bit translation operating list.

32. The analog to digital converter of claim 30, wherein the code producing the multilevel signal is further derived by interchanging bit channel assignments.

33. An analog to digital converter comprising:
    a plurality of comparators for receiving a multilevel signal generated according to a four bit Gray code derived from a bit translation operating list comprising CBCADABCBADBDCD with an operator comprising A and the operator returning an original seed from a last word in the four bit Gray code;
    a plurality of decoder blocks coupled to comparators for decoding the multilevel signal, wherein each decoder block comprises an equal number of inputs.

34. The analog to digital converter of claim 33, wherein the code producing the multilevel signal is further derived by cyclically rotating the bit translation operating list.

35. The analog to digital converter of claim 33, wherein the code producing the multilevel signal is further derived by interchanging bit channel assignments.

36. An analog to digital converter comprising:
    a plurality of comparators for receiving a multilevel signal generated according to a five bit Gray code derived from a bit translation operating list comprising ABACABADABEBDCDEBEDCACDECEBDCDE, with an operator comprising D and the operator returning an original seed from a last word in the five bit Gray code;

a plurality of decoder blocks coupled to comparators for decoding the multilevel signal, wherein each decoder block comprises an equal number of inputs.

37. The analog to digital converter of claim 36, wherein the code producing the multilevel signal is further derived by cyclically rotating the bit translation operating list.

38. The analog to digital converter of claim 36, wherein the code producing the multilevel signal is further derived by interchanging bit channel assignments.

39. A method for high speed communications comprising:
receiving data;
modulating the data to produce a multilevel signal according to a three bit Gray code derived from a bit translation operating list comprising ABCBABC with an operator comprising B and the operator returning an original seed from a last word in the three bit Gray code;
receiving the multilevel signal; and
converting the multilevel signal to a set of binary signals with decoder blocks, wherein each decoder block comprises an equal number of inputs.

40. The method of claim 39, further comprising deriving the multilevel signal by cyclically rotating the bit translation operating list to yield an alternate code.

41. The method of claim 39, further comprising deriving the multilevel signal by interchanging bit channel assignments.

42. A method for high speed communications comprising:
receiving data;
modulating the data to produce a multilevel signal according to a four bit Gray code derived from a bit translation operating list comprising CBCADABCBADBDCD with an operator comprising A and the operator returning an original seed from a last word in the four bit Gray code;
receiving the multilevel signal; and
converting the multilevel analog signal to a set of binary signals with decoder blocks, wherein each decoder block comprises an equal number of inputs.

43. The method of claim 42, further comprising deriving the multilevel signal by cyclically rotating the bit translation operating list to yield an alternate code.

44. The method of claim 42, further comprising deriving the multilevel signal by interchanging bit channel assignments.

45. A method for high speed communications comprising:
receiving data;
modulating the data to produce a multilevel signal to produce a five bit Gray code derived from a bit translation operating list comprising ABACABADABEBDCDEBEDCACDECEBDCDE, with an operator comprising D and the operator returning an original seed from a last word in the five bit Gray code;
receiving the multilevel signal; and
converting the multilevel signal to a set of binary signals with decoder blocks, wherein each decoder block comprises an equal number of inputs.

46. The method of claim 45, further comprising deriving the multilevel signal by cyclically rotating the bit translation operating list to yield an alternate code.

47. The method of claim 45, further comprising deriving the multilevel signal by interchanging bit channel assignments.

* * * * *